US012787336B2

(12) United States Patent
Basker et al.

(10) Patent No.: US 12,787,336 B2
(45) Date of Patent: Nov. 3, 2026

(54) ISOLATION MODULE FOR BACKSIDE POWER DELIVERY

(71) Applicant: Applied Materials, Inc., Santa Clara, CA (US)

(72) Inventors: Veeraraghavan S. Basker, Schenectady, NY (US); Gregory Costrini, Flanders, NJ (US); Ashish Pal, San Ramon, CA (US); Benjamin Colombeau, Salem, MA (US); Balasubramanian Pranatharthiharan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 307 days.

(21) Appl. No.: 18/738,717

(22) Filed: Jun. 10, 2024

(65) Prior Publication Data

US 2025/0040170 A1 Jan. 30, 2025

Related U.S. Application Data

(60) Provisional application No. 63/529,662, filed on Jul. 28, 2023.

(51) Int. Cl.
*H10D 30/43* (2025.01)
*H10D 30/01* (2025.01)
(Continued)

(52) U.S. Cl.
CPC ........... *H10D 30/43* (2025.01); *H10D 30/014* (2025.01); *H10D 30/6735* (2025.01);
(Continued)

(58) Field of Classification Search
CPC .. H10D 30/43; H10D 30/014; H10D 30/6735; H10D 30/6757; H10W 10/014
See application file for complete search history.

(56) References Cited

U.S. PATENT DOCUMENTS

2021/0359091 A1 11/2021 Hsu et al.
2021/0399099 A1 12/2021 Chu et al.
(Continued)

FOREIGN PATENT DOCUMENTS

CN 113206080 A 8/2021
KR 20200086606 A 7/2020
TW 202109742 A 3/2021

OTHER PUBLICATIONS

International Search Report and Written Opinion dated Sep. 30, 2024 for Application No. PCT/US2024/033239.
(Continued)

*Primary Examiner* — Marvin Payen
(74) *Attorney, Agent, or Firm* — Patterson + Sheridan, LLP

(57) ABSTRACT

A method of forming a portion of a gate-all-around field-effect transistor (GAA FET) includes forming placeholders, each interfacing with an extension region via a cap layer, in recesses formed in portions of a substrate isolated by shallow trench isolations (STIs), the recesses extending into an inter-layer dielectric (ILD) formed on the substrate, removing the placeholders selectively to the substrate, the cap layers, and the STIs, forming selective cap layers at bottoms of the recesses, performing a substrate removal process to isotropically etch the substrate within the recesses, performing a conformal deposition process to form a spacer on exposed surfaces of the substrate and the selective cap layers within the recesses, sculpting the spacer on sidewalls of the substrate and the STIs within the recesses, performing a cap layer removal process to remove the cap layers within the recesses, and forming metal contacts within the recesses.

20 Claims, 15 Drawing Sheets

(51) Int. Cl.

| | |
|---|---|
| ***H10D 30/67*** | (2025.01) |
| ***H10W 10/00*** | (2026.01) |
| ***H10W 10/17*** | (2026.01) |
| ***H10W 20/00*** | (2026.01) |

(52) U.S. Cl.
CPC ...... *H10D 30/6757* (2025.01); *H10W 10/014* (2026.01); *H10W 10/17* (2026.01); *H10W 20/069* (2026.01); *H10W 20/083* (2026.01)

(56) References Cited

U.S. PATENT DOCUMENTS

| | | | |
|---|---|---|---|
| 2022/0157949 | A1 | 5/2022 | Huang et al. |
| 2023/0170400 | A1 | 6/2023 | Pal et al. |
| 2023/0207553 | A1 | 6/2023 | Xie et al. |
| 2023/0386829 | A1 | 11/2023 | Asrani et al. |

OTHER PUBLICATIONS

Office Action from Taiwanese Patent Application No. 113127749 dated Mar. 30, 2026.

Korean Office Action for Application No. 10-2025-7032595 dated Jul. 16, 2026.

ISOLATION MODULE FOR BACKSIDE POWER DELIVERY

CROSS-REFERENCE TO RELATED APPLICATIONS

This application claims priority to U.S. Provisional Application Ser. No. 63/529,662 filed Jul. 28, 2023, which is herein incorporated by reference in its entirety.

BACKGROUND

Field

Embodiments described herein generally relate to semiconductor device fabrication, and more particularly, to forming an isolation module for backside power delivery.

Description of the Related Art

Traditionally, chips are constructed with transistors on a front side of a silicon wafer and all interconnects that power them and transmit their data signals built above them. One of the key technologies to enable scaling below 3 nm involves delivering of power on a back side of a chip. This backside power delivery eliminates the need to share interconnect resources between signals and power lines on a front side of the chip as power is moved to the back side of the chip. Backside power delivery further eliminates the need for a power delivery track from lower layer front side interconnects, leading to cost savings. Backside power delivery also allows different metal layers to be optimally fabricated, such as wider lines for an operating voltage $V_{dd}$ and a common ground voltage $V_{ss}$, and thinner lines to carry signals.

However, backside power delivery creates new challenges, such as patterning electrical contact features isolated from one another by isolation modules on a backside of a chip within tight spaces without impacting performance of transistors on a front side of the chip.

Therefore, there is a need for methods for overcoming such challenges in backside power delivery.

SUMMARY

Embodiments of the present disclosure provide a method of forming a portion of a gate-all-around field-effect transistor (GAA FET). The method includes performing a placeholder forming process to form placeholders, each interfacing with an extension region via a cap layer, in recesses formed in portions of a substrate isolated by shallow trench isolations (STIs), the recesses extending into an inter-layer dielectric (ILD) formed on the substrate, performing a placeholder removal process to remove the placeholders selectively to the substrate, the cap layers, and the STIs, performing a selective deposition process to form selective cap layers at bottoms of the recesses, performing a substrate removal process to isotropically etch the substrate within the recesses, performing a conformal deposition process to form a spacer on exposed surfaces of the substrate and the selective cap layers within the recesses, performing a spacer sculpt process to sculpt the spacer on sidewalls of the substrate and the STIs within the recesses, performing a cap layer removal process to remove the cap layers within the recesses, and performing a contact metallization process to form metal contacts within the recesses.

Embodiments of the present disclosure also provide a method of forming a portion of a gate-all-around field-effect transistor (GAA FET). The method includes performing a placeholder forming process to form placeholders, each interfacing with an extension region via a cap layer, in recesses formed in portions of a substrate isolated by shallow trench isolations (STIs), the recesses extending into an inter-layer dielectric (ILD) formed on the substrate, performing a placeholder removal process to remove the placeholders selectively to the substrate, the cap layers, and the STIs, performing a substrate removal process to isotropically etch the substrate within the recesses, performing a conformal deposition process to form a spacer on exposed surfaces of the substrate and the cap layer within the recesses, performing a spacer sculpt process to sculpt the spacer on sidewalls of the substrate and the STIs within the recesses, performing a cap layer removal process to remove the cap layers within the recesses, and performing a contact metallization process to form metal contacts within the recesses.

Embodiments of the present disclosure further provide a semiconductor structure forming a portion of a gate-all-around field-effect transistor (GAA FET). The method includes channel layers embedded in an inter-layer dielectric (ILD) formed on a substrate, the channel layers extending in a first direction, a metal gate embedded in the ILD, the metal gate extending in the first direction, a source/drain (S/D) contact that is electrically connected to the channel layers via an extension region and S/D epitaxial layers on both sides of the channel layers, shallow trench isolations (STIs) formed within the substrate, metal contacts formed between the STIs, the metal contacts extending in a second direction orthogonal to the first direction, wherein each of the metal contacts is electrically connected to one of the S/D epitaxial layers and surrounded by a spacer, and a cap layer formed between the extension region and the spacer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

Figure 1:
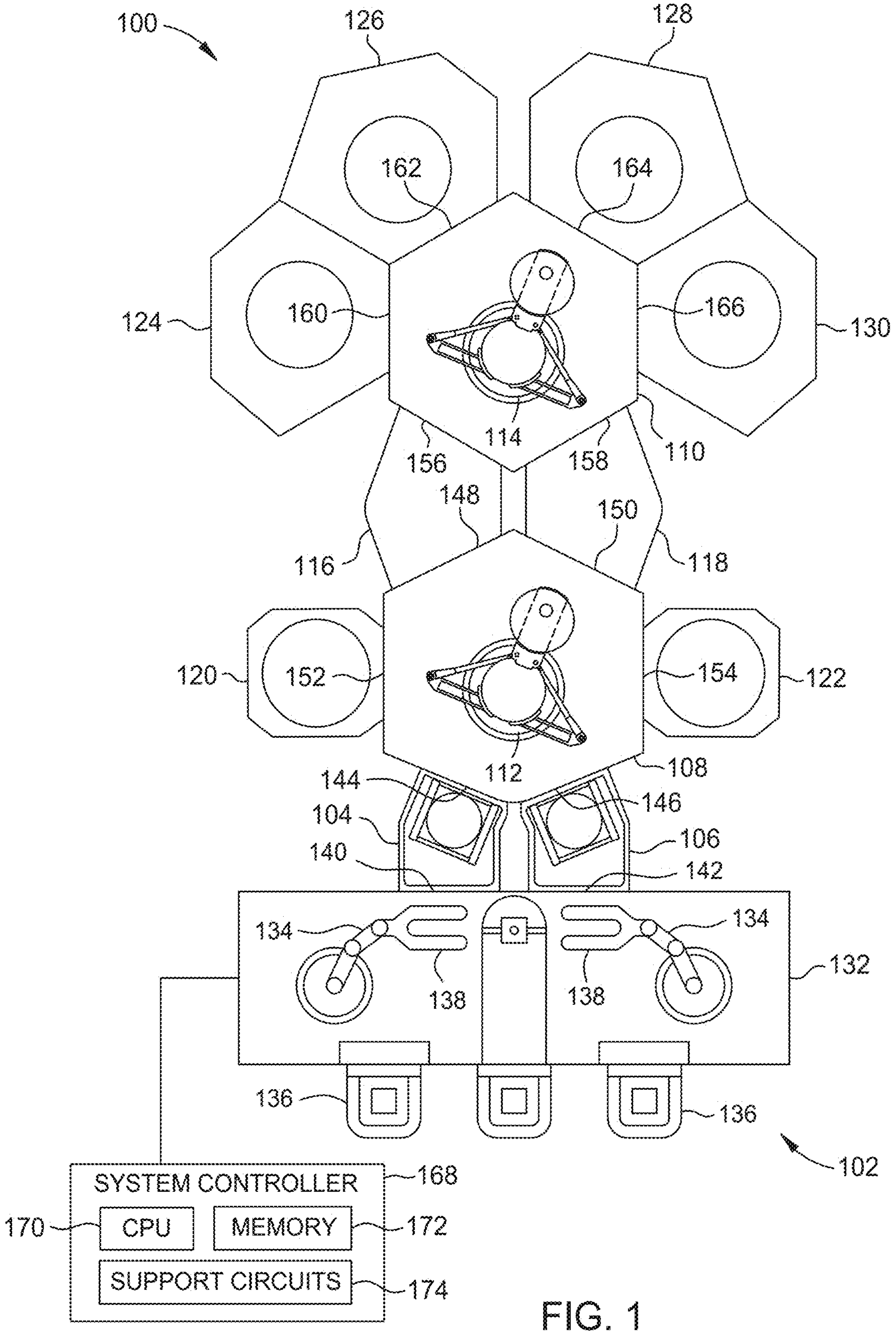
FIG. 1 is a schematic top view of a multi-chamber processing system, according to one or more embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation. In the figures and the following description, an orthogonal coordinate system including an X-axis, a Y-axis, and a Z-axis is used. The directions represented by the arrows in the drawings are assumed to be positive directions for convenience. It is contemplated that elements disclosed in some embodiments may be beneficially utilized on other implementations without specific recitation.

DETAILED DESCRIPTION

The embodiments described herein provide methods for forming metal contacts isolated from one another by an inter-layer dielectric (ILD) on a backside of a chip while protecting extension regions (e.g., doped silicon (Si) or silicon germanium (SiGe)) on a front side of the chip. Since pattering a silicon (Si) wafer from the backside selectively to the extension regions is not possible, selective bottom layers (e.g., silicon nitride ($Si_3N_4$)) are used while etching the silicon (Si) wafer. These selective bottom layers also protect underlying extension regions from any damage during the etching of the silicon (Si) wafer.

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing etch processes, the processing chamber 122 can be capable of performing cleaning processes, the processing chamber 124 can be capable of performing selective removal processes, the processing chamber 126 can be capable of performing chemical vapor deposition (CVD) deposition processes, and the processing chambers 128, 130 can be capable of performing respective epitaxial growth processes. The processing chamber 120 may be a Selectra™ Etch chamber available from Applied Materials of Santa Clara, Calif. The processing chamber 122 may be a SiCoNi™ Pre-clean chamber available from Applied Materials of Santa Clara, Calif. The processing chamber 126 may be a W×Z™ chamber available from Applied Materials of Santa Clara, Calif. The processing chamber 128, or 130 may be a Centura™ Epi chamber available from Applied Materials of Santa Clara, Calif.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Figure 2:
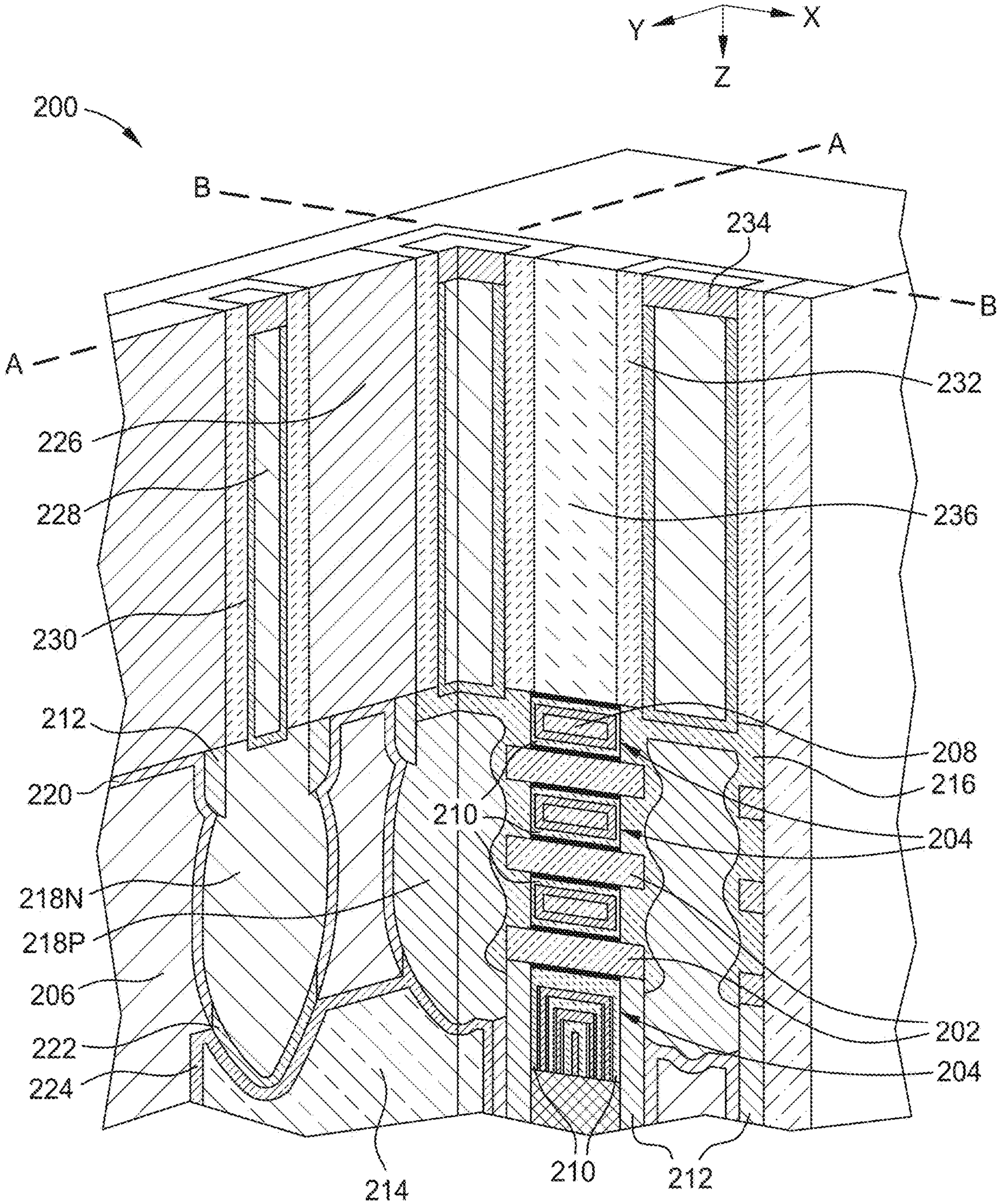
FIG. 2 is an isometric view of a portion of a semiconductor structure that may form a gate-all-around field-effect transistor (GAA FET), according to one or more embodiments of the present structure.

FIG. 2 is an isometric view of a portion of a semiconductor structure 200 that may form a gate-all-around field-effect transistor (GAA FET), according to one or more embodiments of the present structure. In FIG. 2, a cut-out of the semiconductor structure 200 along the YZ plane including the line A-A, and a cut-out of the semiconductor structure 200 along the ZX plane including the line B-B are shown. The semiconductor structure 200 is formed on a substrate and a back side of the semiconductor structure 200 is shown upwards in FIG. 2.

The term "substrate" as used herein refers to a layer of material that serves as a basis for subsequent processing operations and includes a surface to be cleaned. The substrate may be a silicon based material or any suitable insulating materials or conductive materials as needed. The substrate may include a material such as crystalline silicon (e.g., Si<100> or Si<111>), silicon oxide, strained silicon, silicon germanium, doped or undoped polycrystalline silicon, doped or undoped silicon wafers and patterned or non-patterned wafers, silicon on insulator (SOI), carbon doped silicon oxides, silicon nitride, doped silicon, germanium, gallium arsenide, glass, or sapphire.

As shown in FIG. 2, the semiconductor structure 200 includes channel layers 202 and replacement-metal-gate (RMG) stacks 204, extending in the Y direction, embedded within an inter-layer dielectric (ILD) 206. Each of the RMG stacks 204 includes a gate metal 208 and a high-k material 210. The gate metal 208 may be formed of titanium nitride (TiN), or titanium aluminum carbide (TiAlC), or tungsten (W). The high-k material 210 may be formed of hafnium oxides ($HfO_2$), hafnium zirconium oxide ($HfZrO_2$), aluminum oxide ($Al_2O_3$).

The channel layers 202 may be formed of silicon (Si), germanium (Ge), silicon germanium (SiGe), or indium gallium zinc oxide (IGZO). Surfaces of the RMG stacks 204 may be covered by spacers 212. The spacers 212 may be formed of dielectric material, such as silicon oxide ($SiO_2$), silicon oxy-carbide (SiOC), silicon oxy-carbon-nitride (SiOCN), silicon boron carbon nitride (SiBCN), or silicon nitride ($Si_3N_4$). The ILD 206 may be formed of silicon oxide ($SiO_2$), silicon oxynitride (SiON), silicon oxy-carbon-nitride (SiOCN), aluminum oxide ($Al_2O_3$), or any combination thereof.

The semiconductor structure 200 further includes a source/drain (S/D) contact 214 that is electrically connected to the channel layers 202 via an extension region 216 and a p-channel S/D epitaxial (epi) layer 218P, and via an extension region (not shown) and an n-channel S/D epi layer 218N. The p-channel S/D epi layer 218P and the n-channel S/D epi layer 218N are interfaced with the ILD 206 via a contact etch stop layer (CESL) 220, and interfaced with the S/D contact 214 by an interface 222 and a liner 224.

The S/D contact 214 may be formed of tungsten (W), ruthenium (Ru), molybdenum (Mo), copper (Cu), cobalt (Co), titanium (Ti), nickel (Ni), silver (Ag), gold (Au), iridium (Ir), tantalum (Ta), platinum (Pt), conductive oxides or nitrides thereof, or any combination thereof.

The extension region 216 may be formed of silicon germanium (SiGe) with a ratio of germanium (Ge) ranging between 0% and 15%, for example, about 10%, lightly doped with p-type dopants such as boron (B) or gallium (Ga), with a concentration of between about $1\times10^{18}$ $cm^{-3}$ and $5\times10^{20}$ $cm^{-3}$, depending upon the desired conductive characteristic of the extension regions 216.

The p-channel S/D epi layer 218P may be formed of epitaxially grown silicon germanium (SiGe) with a ratio of germanium (Ge) ranging between 25% and 50%, doped with p-type dopants such as boron (B) or gallium (Ga), with a concentration of between about $10^{20}$ $cm^{-3}$ and $5\cdot10^{21}$ $cm^{-3}$, depending upon the desired conductive characteristic of the p-channel S/D epi layer 218P.

The n-channel S/D epi layer 218N may be formed of epitaxially grown silicon (Si), doped with n-type dopants, such as phosphorus (P), arsenic (As), or antimony (Sb), with a concentration of between about $10^{20}$ $cm^{-3}$ and $5\times10^{21}$ $cm^{-3}$, depending upon the desired conductive characteristic of the n-channel S/D epi layers 218N.

The interfaces 222 may be formed of metal silicide, such as titanium silicide (TiSi, $TiSi_2$), nickel silicide (NiSi, $Ni_2Si$), molybdenum silicide (MoSi, $MoSi_2$), cobalt silicide ($CoSi_2$), tantalum silicide ($TaSi_2$), or any combination thereof.

The liner 224 may be formed of titanium nitride (TiN), tantalum nitride (TaN), titanium aluminum carbide (TiAlC), tungsten (W), lanthanum oxide ($La_2O_3$), or aluminum oxide ($Al_2O_3$).

The semiconductor structure 200 further includes shallow trench isolations (STIs) 226 formed within the substrate. The STIs 226 may be formed of silicon oxide ($SiO_2$). The p-channel S/D epi layer 218P and the n-channel S/D epi layer 218N are electrically connected to metal contacts 228, extending in the Z direction, formed between the STIs 226. The metal contacts 228 are each connectable to a voltage source (not shown). The metal contacts 228 may be each surrounded by a barrier layer 230 and a spacer 232, and capped with a contact cap layer 234. The metal contacts 228 on both sides of the channel layers 202 are isolated by an ILD 236. The metal contacts 228 may each have critical dimensions of about 10 nm and about 40 nm in the XY plane and spaced from one another by about 20 nm and about 50 nm. The metal contacts 228 may have a depth in the Z direction of between about 10 nm and 100 nm. The metal contacts 228 may be formed of tungsten (W), ruthenium (Ru), molybdenum (Mo), copper (Cu), cobalt (Co), titanium (Ti), nickel (Ni), silver (Ag), gold (Au), iridium (Ir), tantalum (Ta), platinum (Pt), conductive oxides or nitrides thereof, or any combination thereof. The barrier layer 230 may be formed of titanium nitride (TiN), tantalum nitride (TaN), titanium aluminum carbide (TiAlC), or tungsten (W). The spacer 232 may be formed of silicon nitride ($Si_3N_4$), silicon oxide ($SiO_2$), silicon oxynitride (SiON), aluminum oxide ($Al_2O_3$), silicon oxy-carbon-nitride (SiOCN), or any combination thereof.

The contact cap layer 234 may be formed of silicon nitride ($Si_3N_4$). The ILD 236 may be formed of silicon oxide ($SiO_2$), silicon oxynitride (SiON), aluminum oxide ($Al_2O_3$), silicon oxy-carbon-nitride (SiOCN), or any combination thereof.

Figure 3:
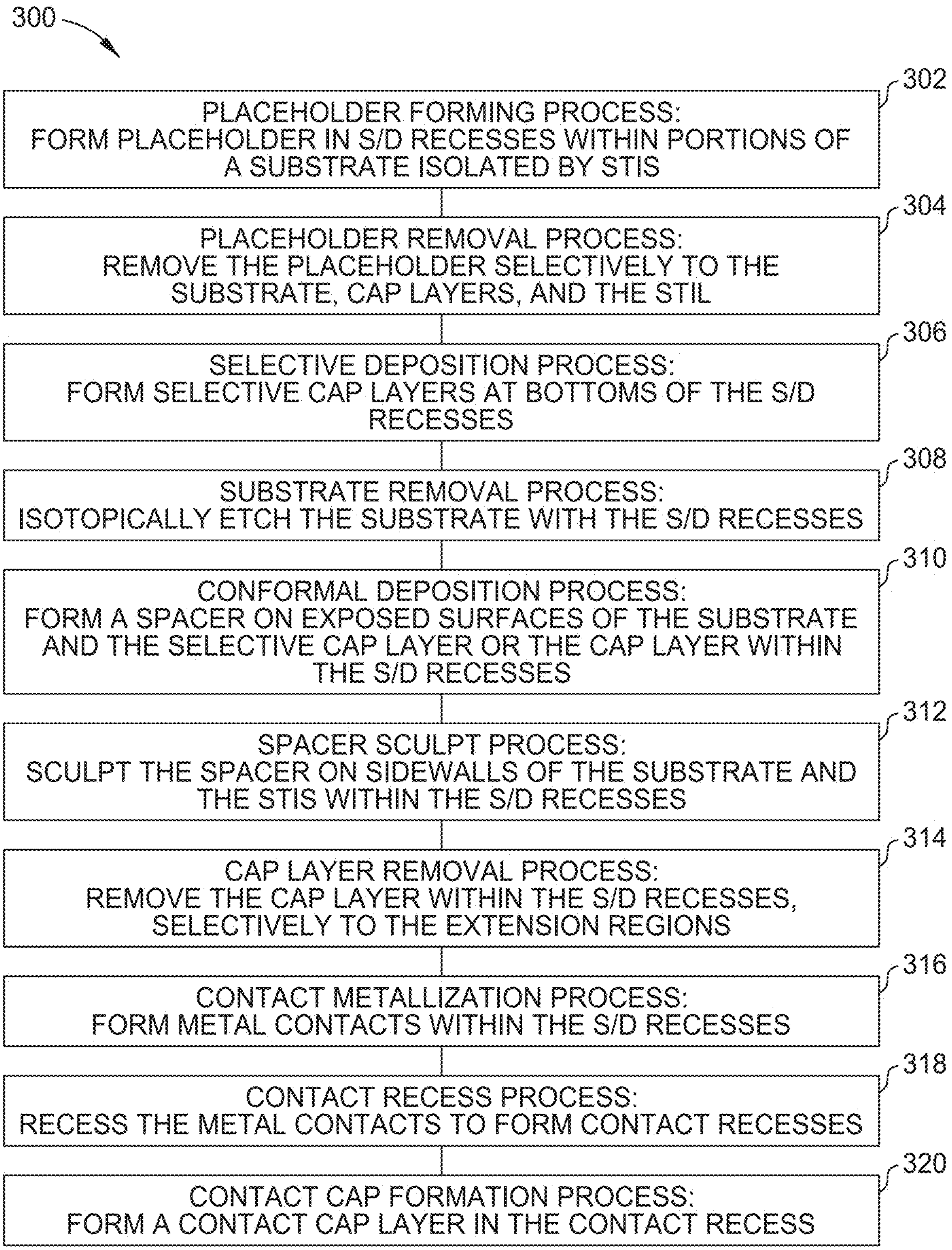
FIG. 3 depicts a process flow diagram of a method of forming cell transistors in a semiconductor structure according to one embodiment.
Figure 4A:
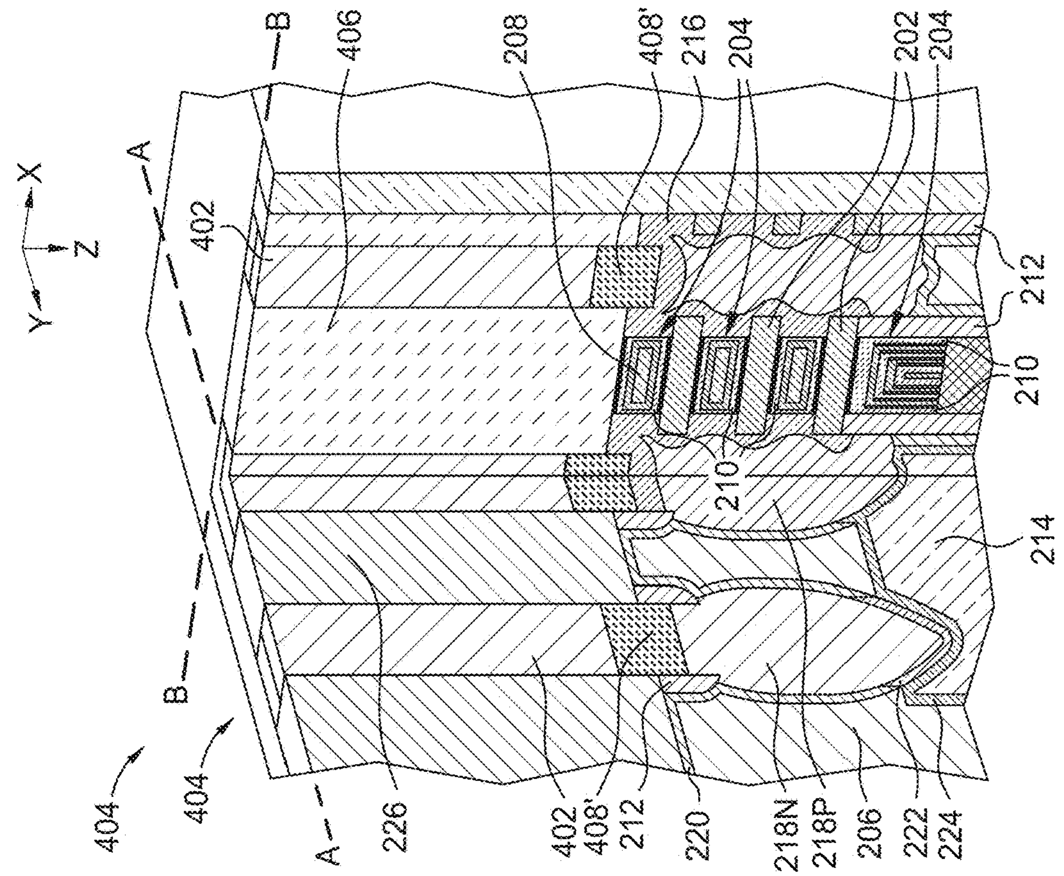
FIGS. 4A, 4A', 4B, 4B', 4C, 4D, 4D', 4E, 4E', 4F, 4F', 4G, 4G', 4H, 4H', 4I, 4I', 4J, 4J', 4K, 4K', 4L, and 4L' are isometric views of a portion of a semiconductor structure corresponding to various states of the method of FIG. 3.
Figure 4A:
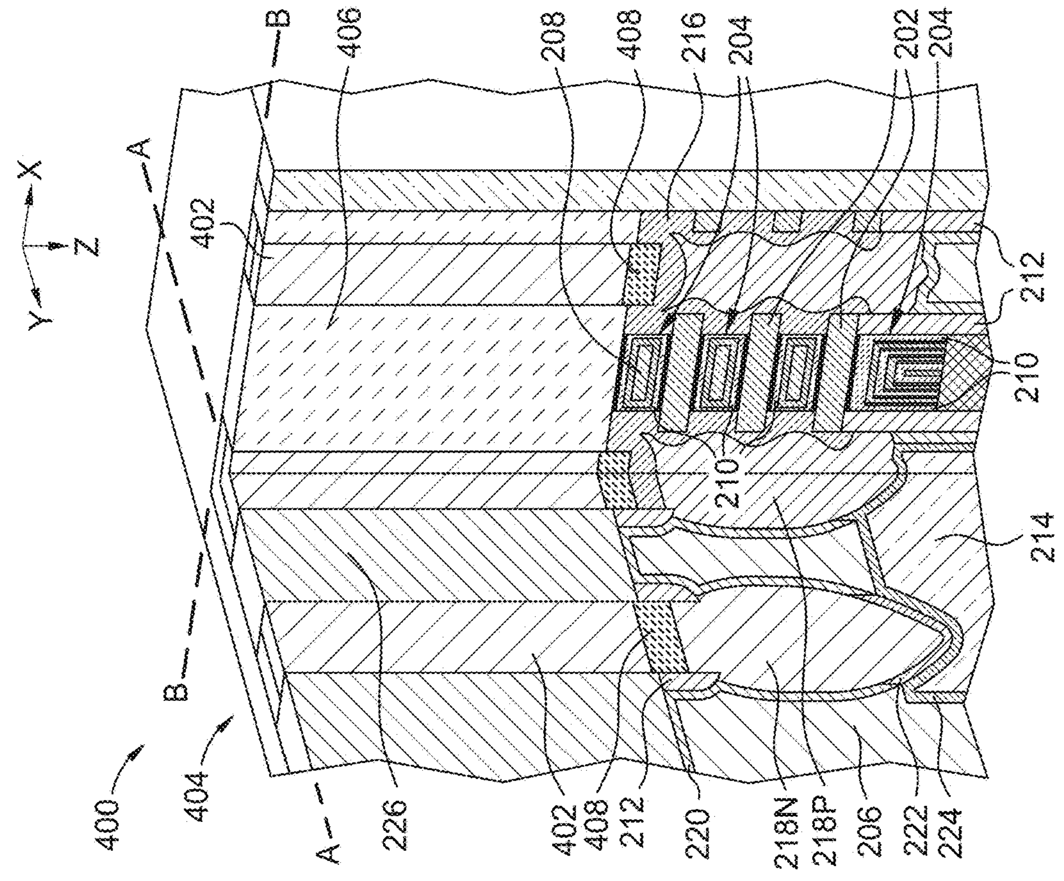

FIG. 3 depicts a process flow diagram of a method 300 of forming a semiconductor structure 400 that may be the semiconductor structure 200 forming a portion of a gate-all-around field-effect transistor (GAA FET), according to one or more embodiments of the present disclosure. FIGS. 4A, 4A', 4B, 4B', 4C, 4D, 4D', 4E, 4E', 4F, 4F', 4G, 4G', 4H, 4H', 4I, 4I', 4J, 4J', 4K, 4K', 4L, and 4L' are isometric views of a portion of the semiconductor structure 400, with a cut-out of the semiconductor structure 400 along the YZ plane including the line A-A and a cut-out of the semiconductor structure 400 along the ZX plane including the line B-B, corresponding to various states of the method 300. It should be understood that FIGS. 4A, 4A', 4B, 4B', 4C, 4D, 4D', 4E, 4E', 4F, 4F', 4G, 4G', 4H, 4H', 4I, 4I', 4J, 4J' 4K, 4K', 4L, and 4L' illustrate only partial schematic views of the semiconductor structure 400, and the semiconductor structure 400 may contain any number of transistor sections and additional materials having aspects as illustrated in the figures. It should also be noted that although the method illustrated in FIG. 3 is described sequentially, other process sequences that include one or more operations that have been omitted and/or added, and/or has been rearranged in another desirable order, fall within the scope of the embodiments of the disclosure provided herein.

The method 300 begins with block 302, in which a placeholder forming process is performed to form placeholders 402 in S/D recesses 404 within portions of a substrate 406 isolated by the STIs 226, as shown in FIG. 4A. The S/D recesses 404 are formed by etching into the ILD 206 and the substrate 406 from a front side of the semiconductor structure 400 (shown downwards in FIG. 4A), using any appropriate lithography and etch processes, such as photolithography and dry anisotropic etching, performed in a processing chamber, such as the processing chamber 120 shown in FIG. 1. The placeholders 402 are formed in portions of the S/D recesses 404 within the substrate 406, using any appropriate deposition process, such as chemical vapor deposition (CVD), or physical vapor deposition (PVD), performed in a processing chamber, such as the processing chamber 126, 128, or 130 shown in FIG. 1. The placeholders 402 each interface with an extension region 216, via a cap layer 408. In the remaining portions of the S/D recesses 404 within the ILD 206, extension regions 216, a p-channel S/D epitaxial (epi) layer 218P and an n-channel S/D epi layer 218N on both sides of the channel layers 202, and interfaces 222 are formed. Subsequently, an S/D contact 214 is formed.

The cap layer 408 may be formed of silicon (Si) having a thickness of between about 1 nm and about 20 nm. The cap layer 408 buffers the extension region 216 from the placeholders 402 and may prevent a damage to the extension regions 216 during etching of the placeholder 402 in the placeholder removal process in block 304. The placeholder 402 may be formed of material, such as silicon germanium (SiGe), that has etch selectively to the substrate 406 (e.g., silicon (Si)), the cap layer 408 (e.g., silicon (Si)), and the STIs 226 (e.g., ($SiO_2$).

Figure 4B:
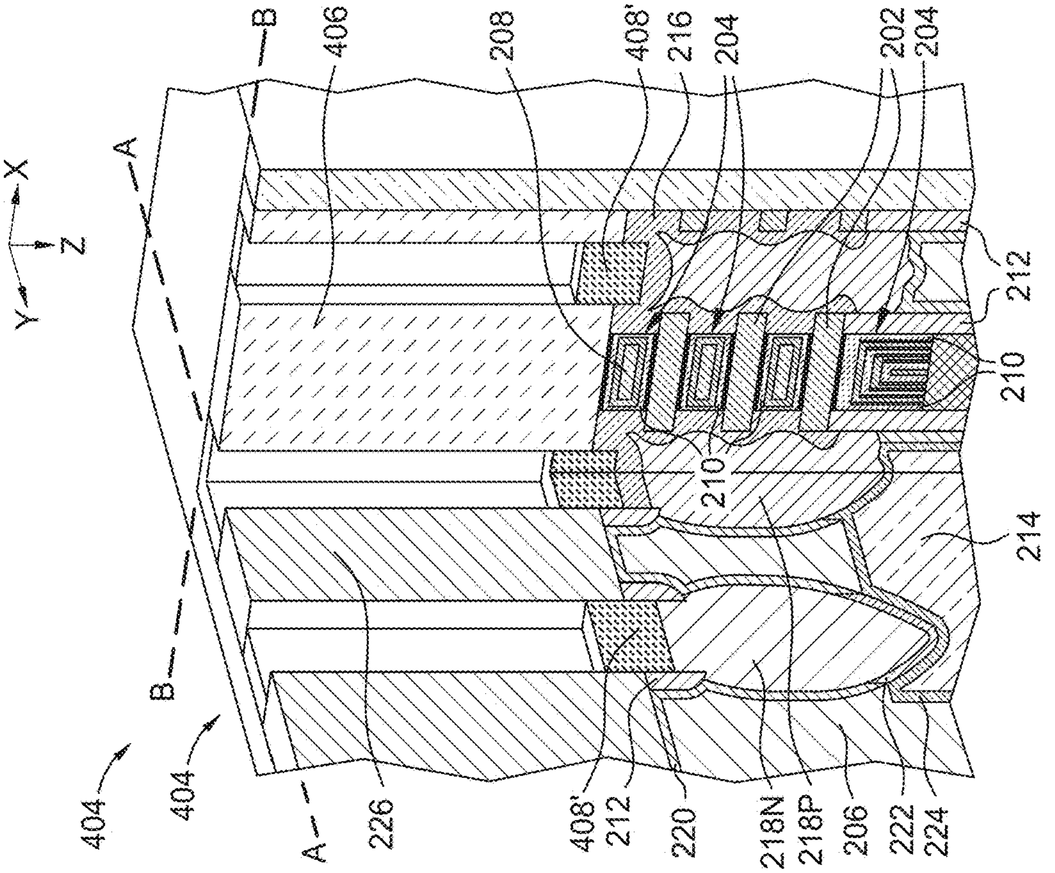
Figure 4B:
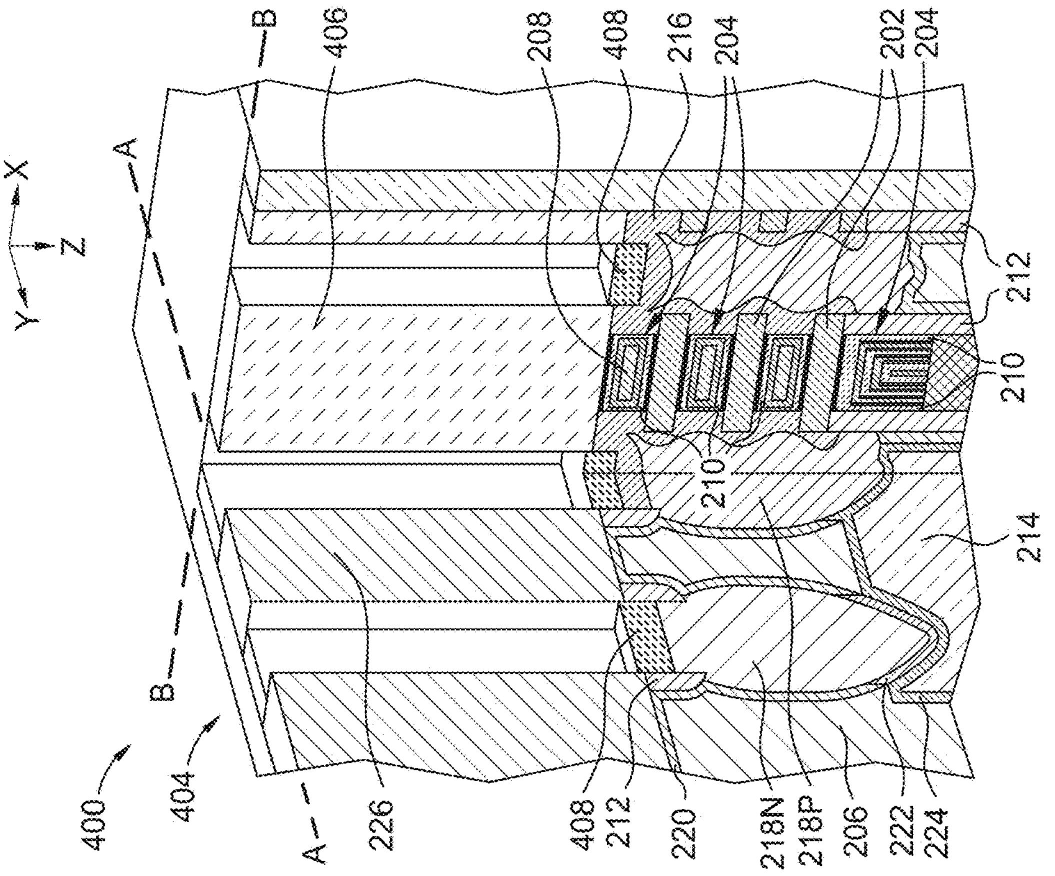

In block 304, a placeholder removal process is performed to remove the placeholders 402 (e.g., silicon germanium (SiGe)) selectively to the substrate 406 (e.g., silicon (Si)), the cap layers 408 (e.g., silicon (Si)), and the STIs 226 (e.g., silicon oxide ($SiO_2$)), as shown in FIG. 4B. The placeholder removal process may include any appropriate dry anisotropic etching or wet etching process, performed in a processing chamber, such as the processing chamber 120 shown in FIG. 1.

Figure 4C:
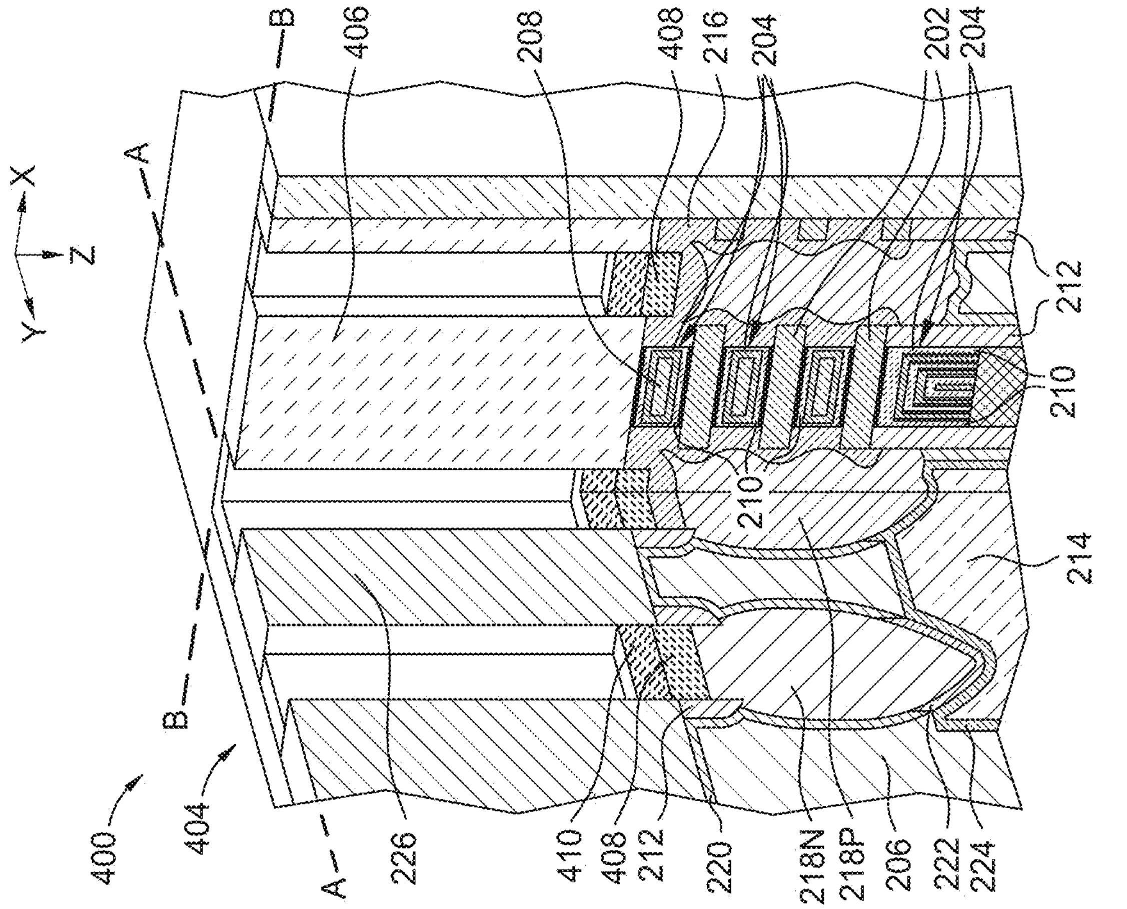

In block 306, a selective deposition process is performed to form selective cap layers 410 at bottoms of the S/D recesses 404, as shown in FIG. 4C. The selective deposition process may include any bottom-up gap fill deposition process, performed in a processing chamber, such as the processing chamber 126, 128, or 130 shown in FIG. 1. The selective cap layers 410 may be formed of any material that have etch selectivity to silicon (Si), such as silicon nitride ($Si_3N_4$), silicon oxide ($SiO_2$), silicon oxy-carbide (SiOC), silicon oxy-carbon-nitride (SiOCN), or amorphous carbon (a-C). The selective cap layers 410 may have a thickness of between about 3 nm and about 30 nm, and act as an etch stop in the isotropic etching process in block 308.

In some other embodiments, alternative to forming the cap layer 408 (e.g., silicon (Si)) in block 302 and the selective cap layer 410 (e.g., silicon nitride ($Si_3N_4$) or amorphous carbon (a-C)) in block 306, a thicker cap layer 408', having a thickness of between about 5 nm and about 30 nm, is formed without forming a selective cap layer thereon, as shown in FIG. 4A'. The thicker cap layer 408' may be used to selectively remove the placeholders 402 (e.g., silicon germanium (SiGe)), as shown in FIG. 4B', in the placeholder removal process in block 304.

Figure 4D:
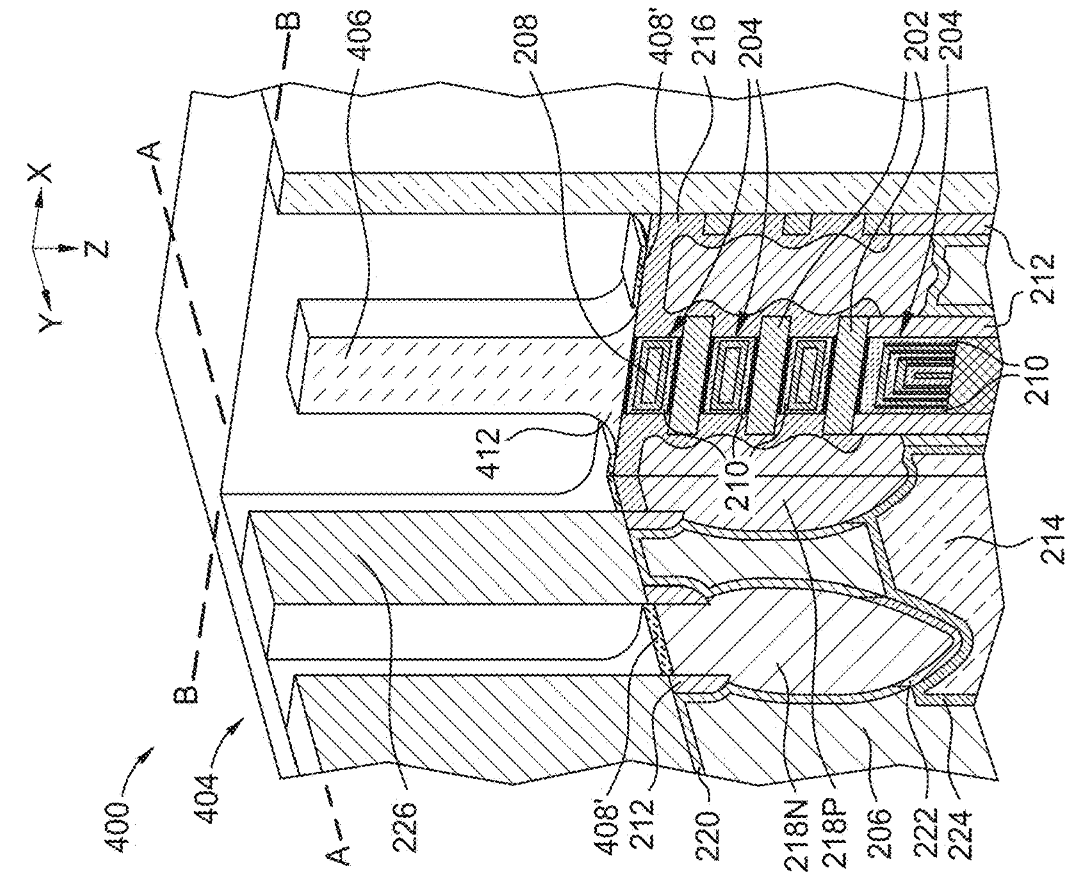
Figure 4D:
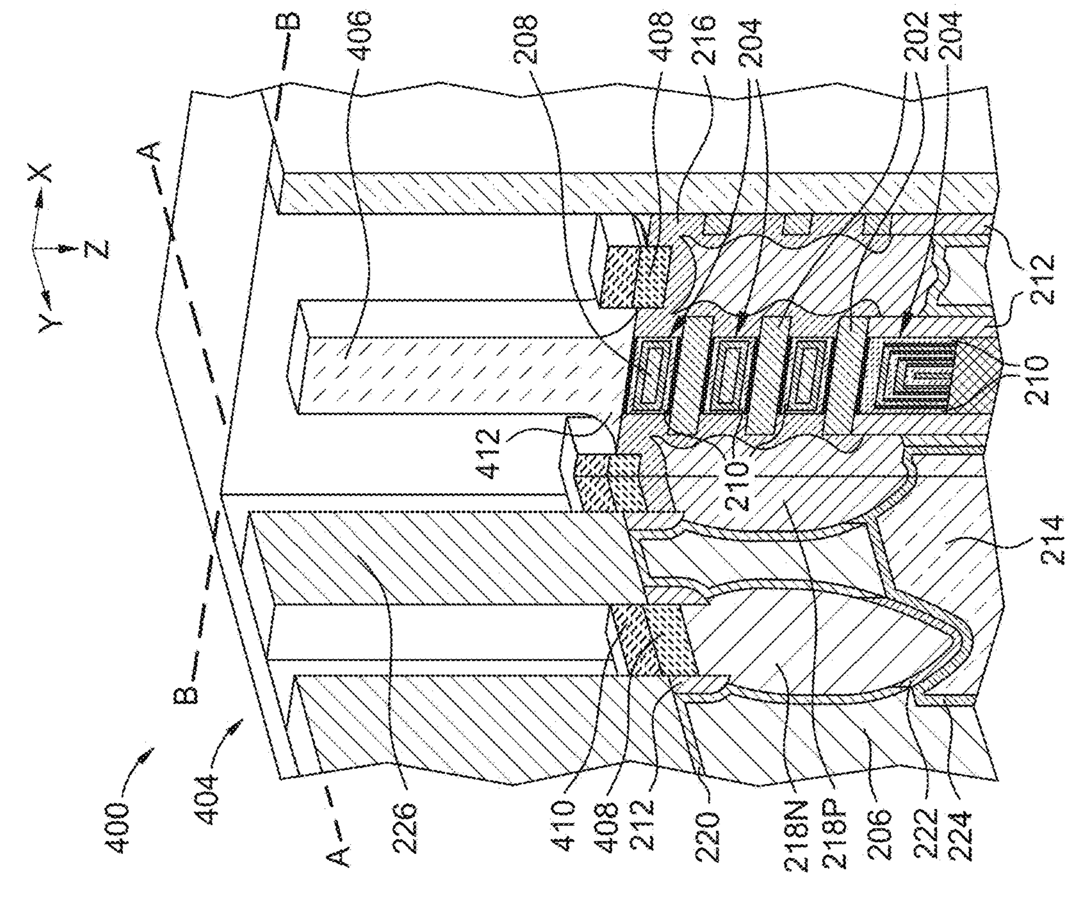

In block 308, a substrate removal process is performed to isotropically etch the substrate 406 with the S/D recesses 404, as shown in FIGS. 4D and 4D'. The substrate removal process may include any appropriate wet isotropic etching process, performed in a processing chamber, such as the processing chamber 120 shown in FIG. 1. In FIG. 4D, due to the thickness of the selective cap layer 410 and the etch selectivity of the substrate 406 (e.g., silicon (Si)) to the selective cap layer 410 (e.g., silicon nitride ($Si_3N_4$) or amorphous carbon (a-C)), portions 412 of the substrate 406 above the extension regions 216 remain un-etched during the isotropic etch process. In FIG. 4D', due to the thickness of the thicker cap layer 408', portions 412 of the substrate 406 above the extension regions 216 remain un-etched during the isotropic etch process. The un-etched portions 412 may prevent any etching into the extension regions 216 in the etching process in block 312.

Figure 4E:
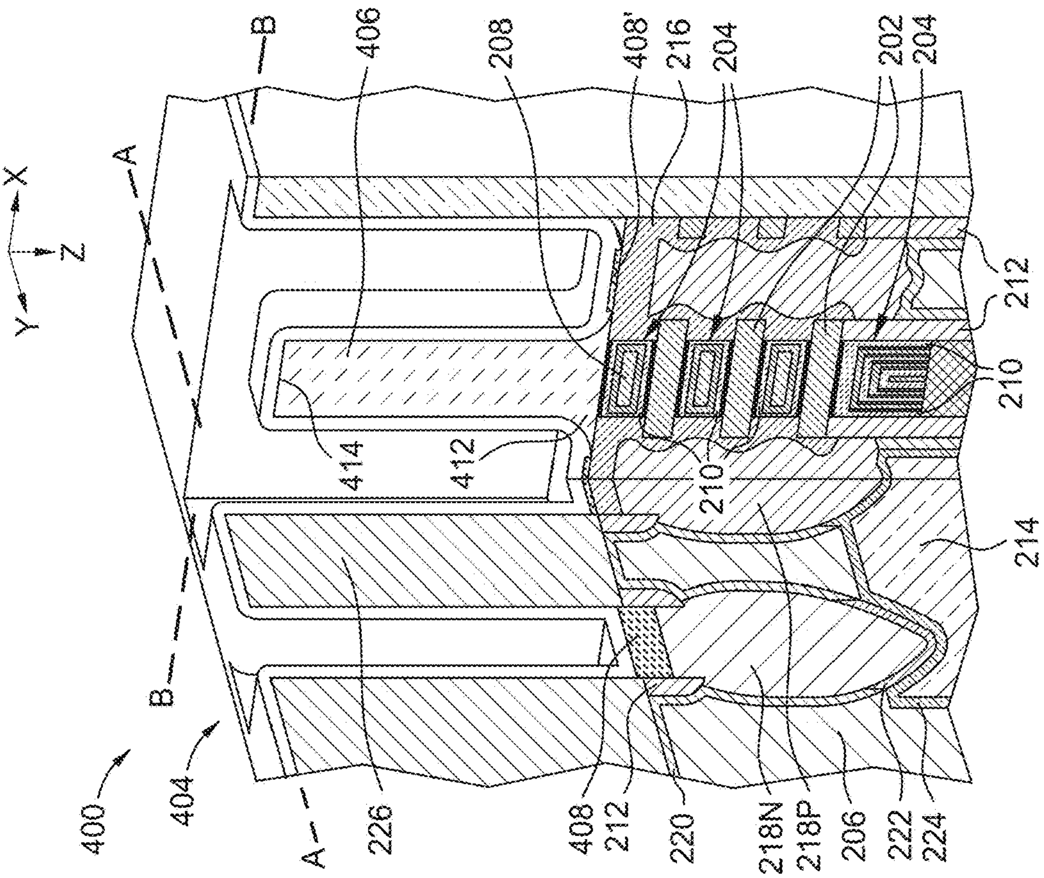
Figure 4E:
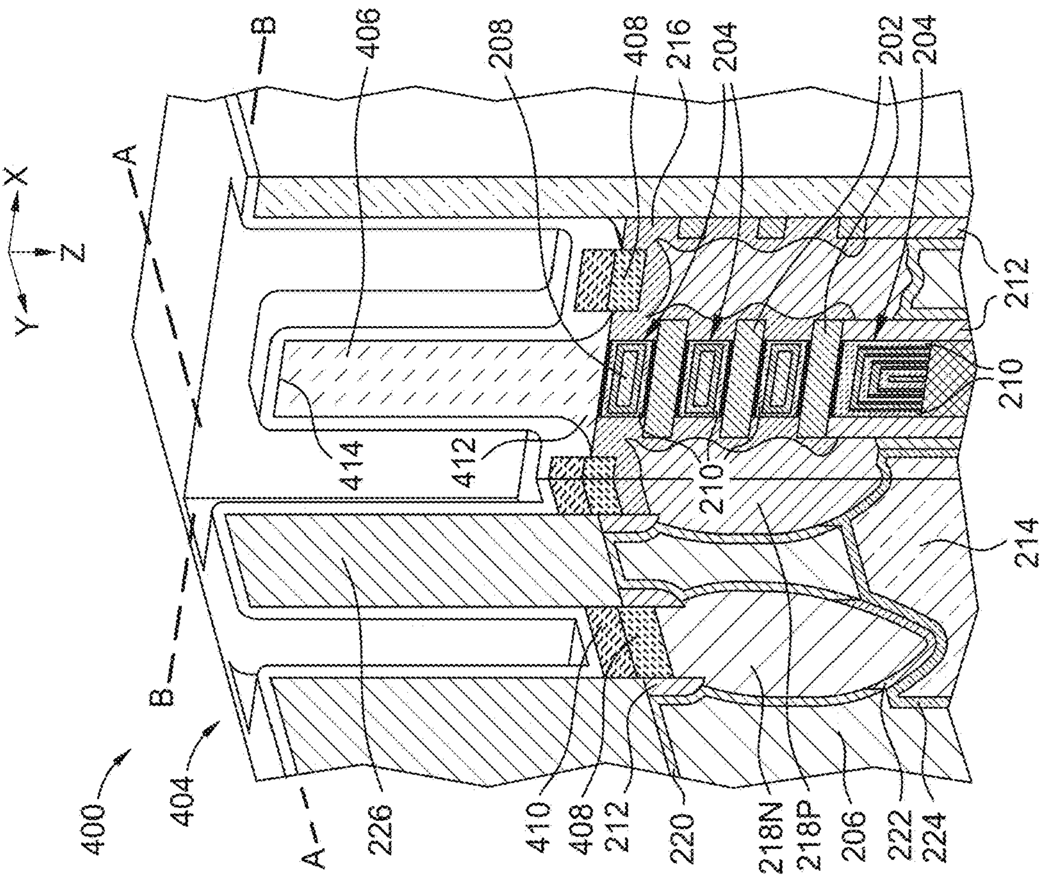

In block 310, a conformal deposition process is performed to form a spacer 232 on exposed surfaces of the substrate 406 and the selective cap layer 410 within the S/D recesses 404, as shown in FIG. 4E, or on exposed surfaces of the substrate 406 and the thicker cap layer 408', as shown in FIG. 4E'. The conformal deposition may include any appropriate deposition process, such as chemical vapor deposition (CVD), or physical vapor deposition (PVD). The spacer 232 may be formed of silicon nitride ($Si_3N_4$), silicon oxide ($SiO_2$), silicon oxynitride (SiON), aluminum oxide ($Al_2O_3$), silicon oxy-carbon-nitride (SiOCN), or any combination thereof. The spacer 232, the un-etched portions 412 of the substrate 406, the selective cap layer 410, and the cap layer 408, shown in FIG. 4E, and the spacer 232, the un-etched portions 412 of the substrate 406, and the thicker cap layer 408, shown in FIG. 4E' form a webbing structure to protect the extension regions 216 from the etching process in block 312.

Figure 4F:
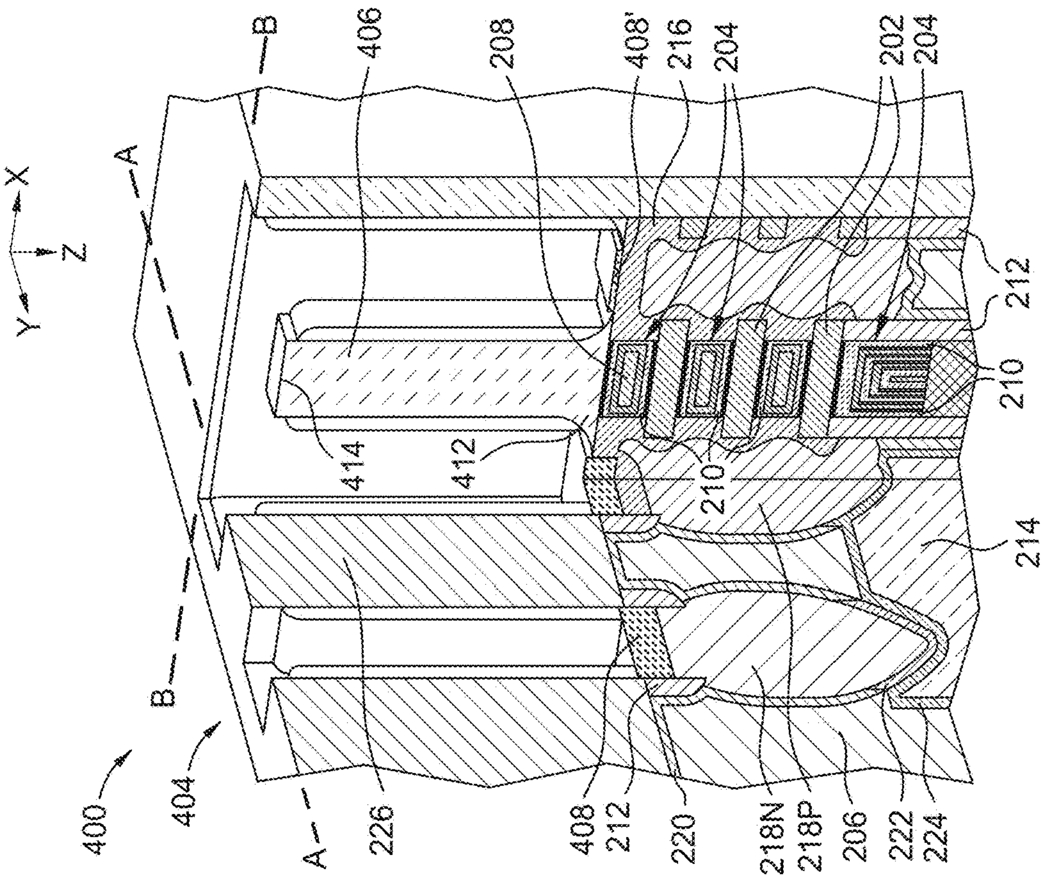
Figure 4F:
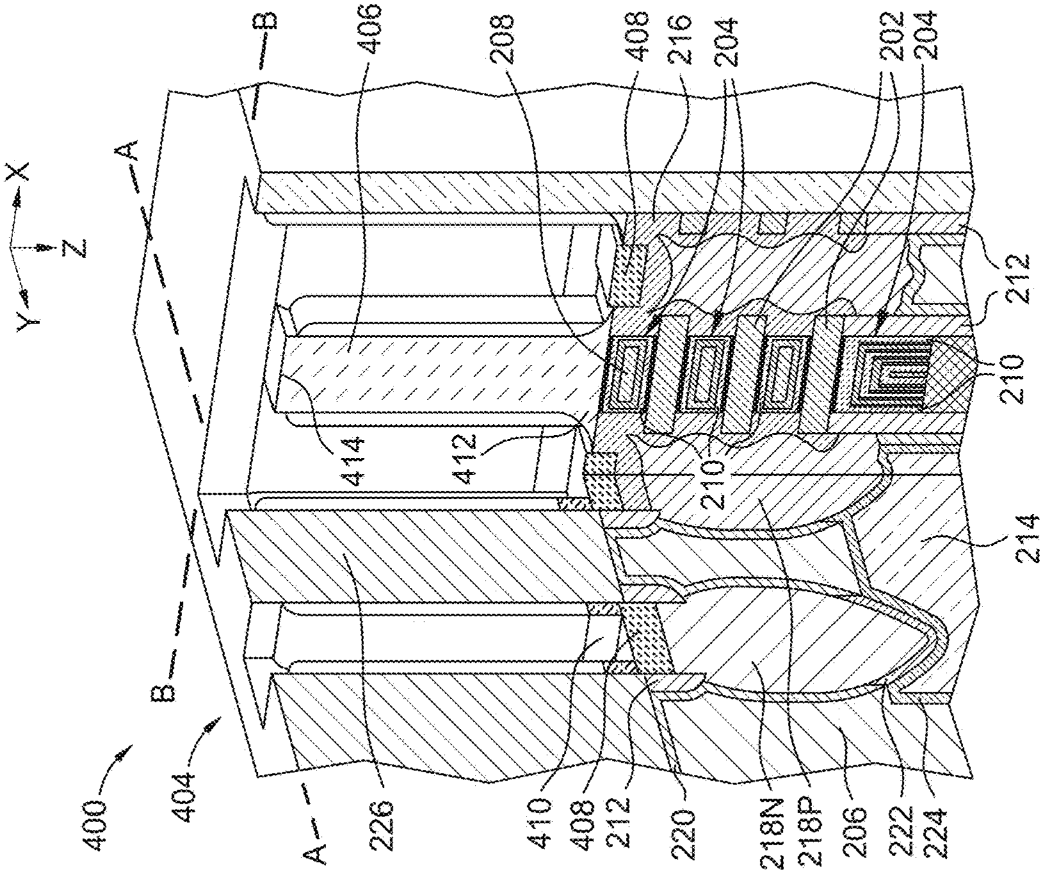

In block 312, a spacer sculpt process is performed to sculpt the spacer 232 on sidewalls of the substrate 406 and the STIs 226 within the S/D recesses 404, as shown in FIGS. 4F and 4F'. The selective spacer removal process may include any appropriate dry anisotropic etching, performed in a processing chamber, such as the processing chamber 120 shown in FIG. 1. The spacer sculpt process removes the spacer 232 on a top surface 414 of the substrate 406 within the S/D recesses 404 and at bottoms of the S/D recesses 404. The selective cap layers 410 at the bottoms of S/D recesses 404 are also removed selectively to the cap layer 408, as shown in FIG. 4F.

Figure 4G:
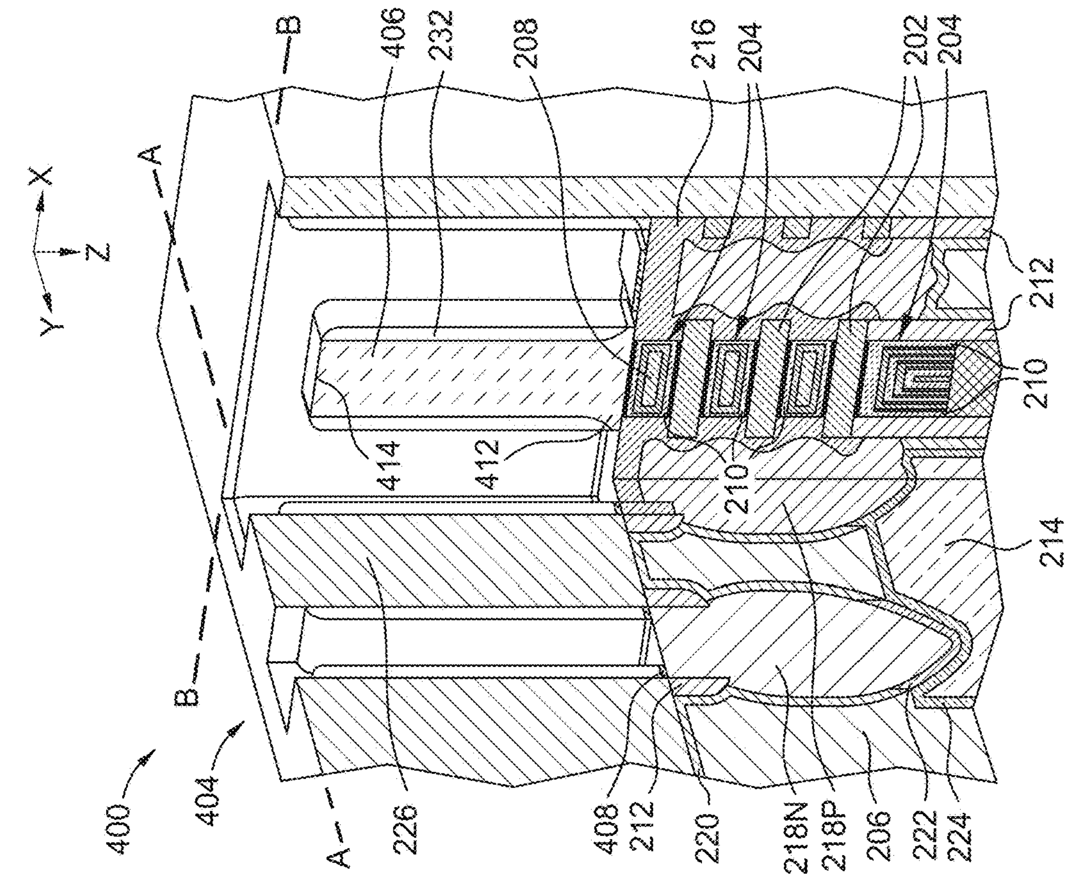
Figure 4G:
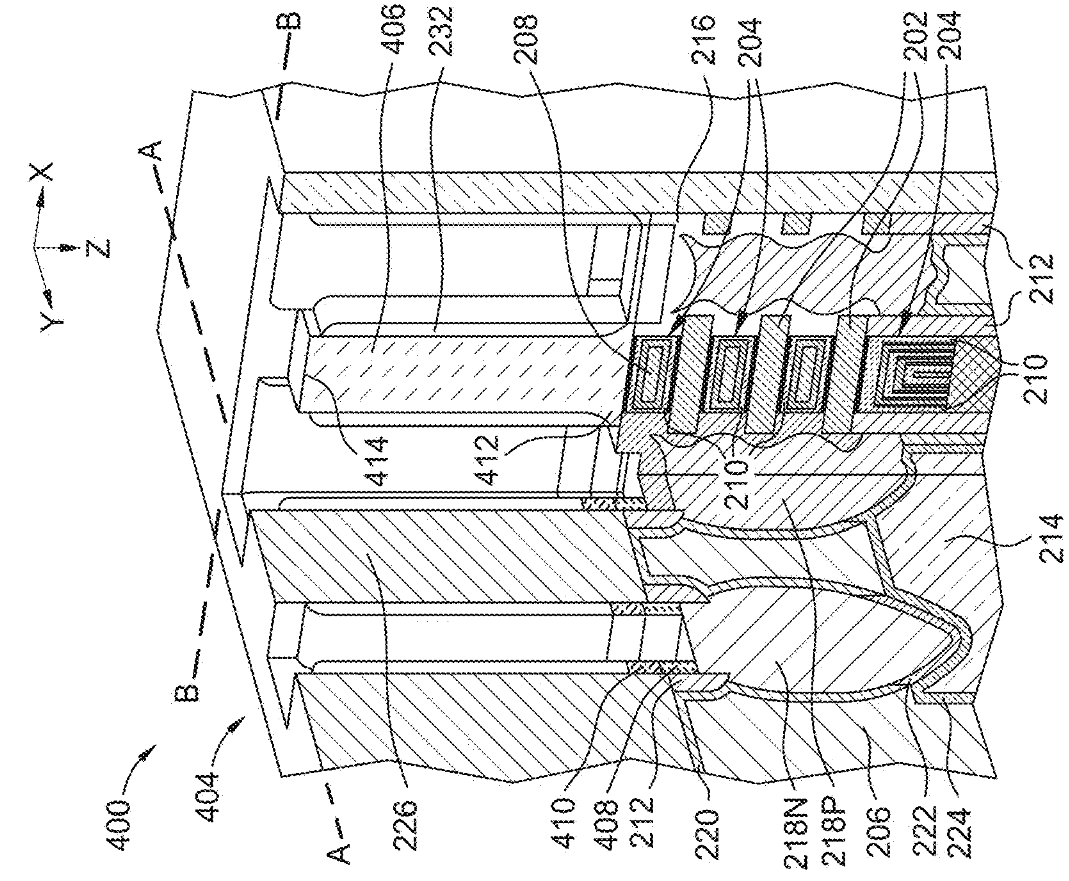

In block 314, a cap layer removal process is performed to remove the cap layer 408 and 408' within the S/D recesses 404, as shown in FIGS. 4G and 4G', where the spacer 232 protects the extension regions 216 from getting etched. The cap layer removal process may include any appropriate dry anisotropic etching, performed in a processing chamber, such as the processing chamber 120 shown in FIG. 1.

Figure 4H:
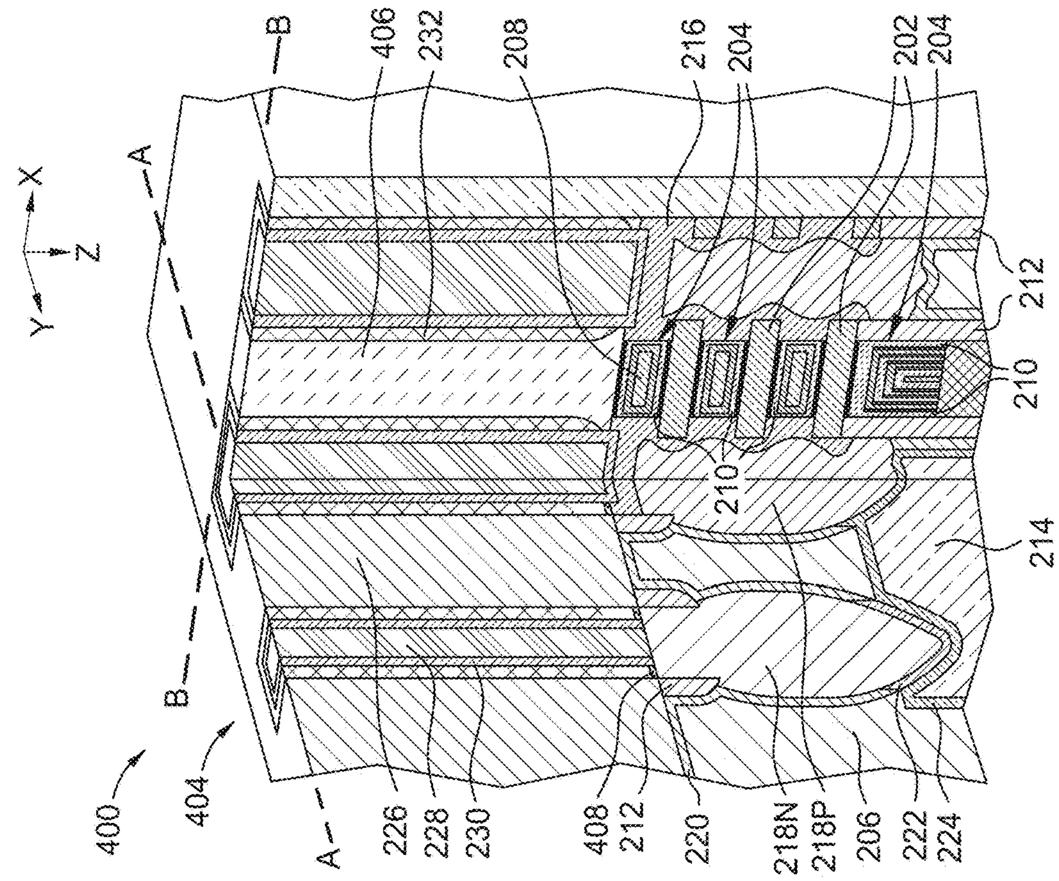
Figure 4H:
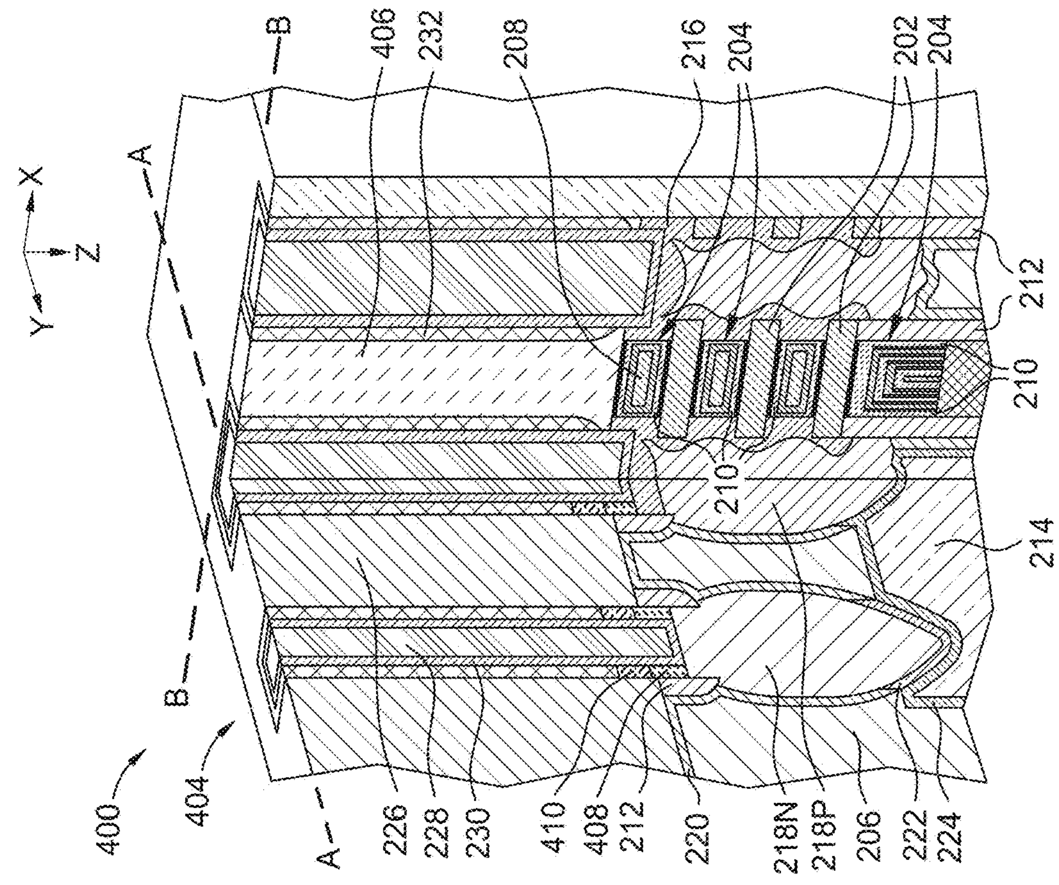

In block 316, a contact metallization process is performed to form metal contacts 228 within the S/D recesses 404, as shown in FIGS. 4H and 4H'. The contact metallization process may include filling the S/D recesses 404 with metal fill material, such as tungsten (W), ruthenium (Ru), molybdenum (Mo), copper (Cu), cobalt (Co), titanium (Ti), nickel (Ni), silver (Ag), gold (Au), iridium (Ir), tantalum (Ta), platinum (Pt), conductive oxides or nitrides thereof, or any combination thereof, by any appropriate deposition process, such as chemical vapor deposition (CVD), physical vapor deposition (PVD), or the like performed in a processing chamber, such as the processing chamber 126, 128, or 130 shown in FIG. 1. The contact metallization process may also include forming a barrier layer 230 surrounding the metal contacts 228. The barrier layer 230 may be formed of titanium nitride (TiN), tantalum nitride (TaN), titanium aluminum carbide (TiAlC), or tungsten (W). The spacer 232 may be formed of silicon nitride ($Si_3N_4$), silicon oxide ($SiO_2$), silicon oxynitride (SiON), aluminum oxide ($Al_2O_3$), silicon oxy-carbon-nitride (SiOCN), or any combination thereof.

Figure 4I:
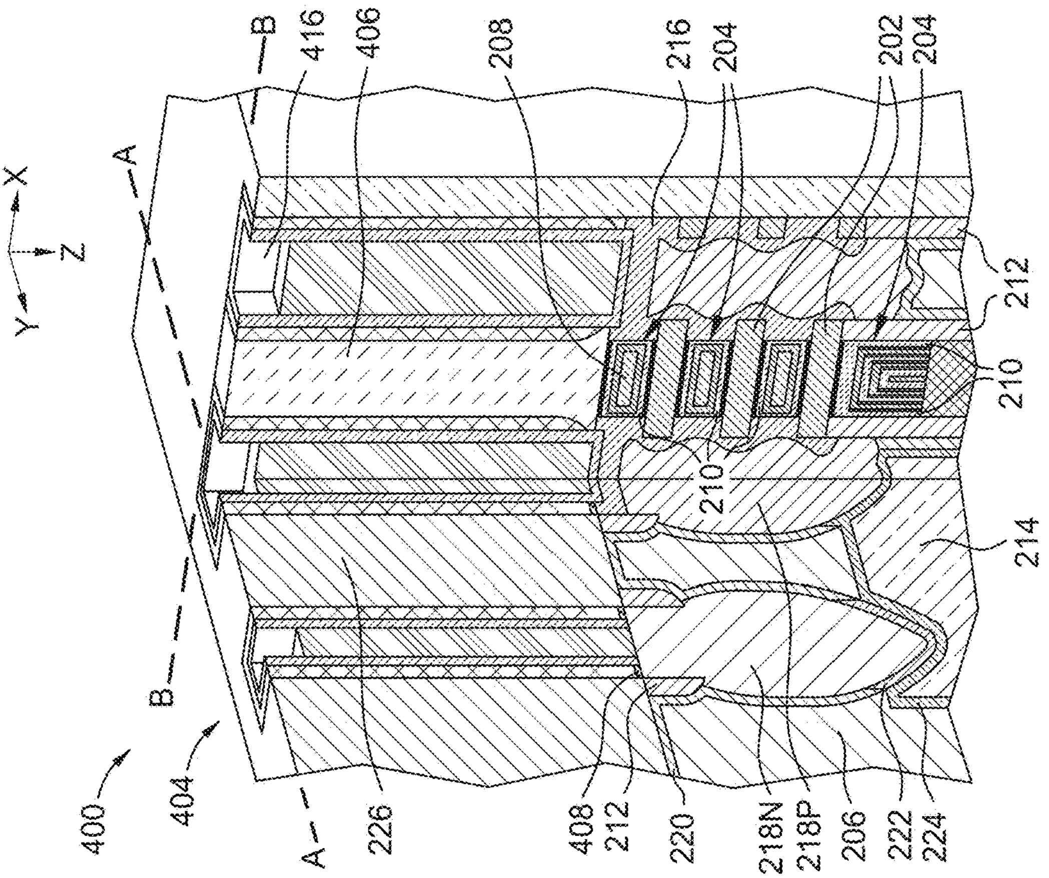
Figure 4I:
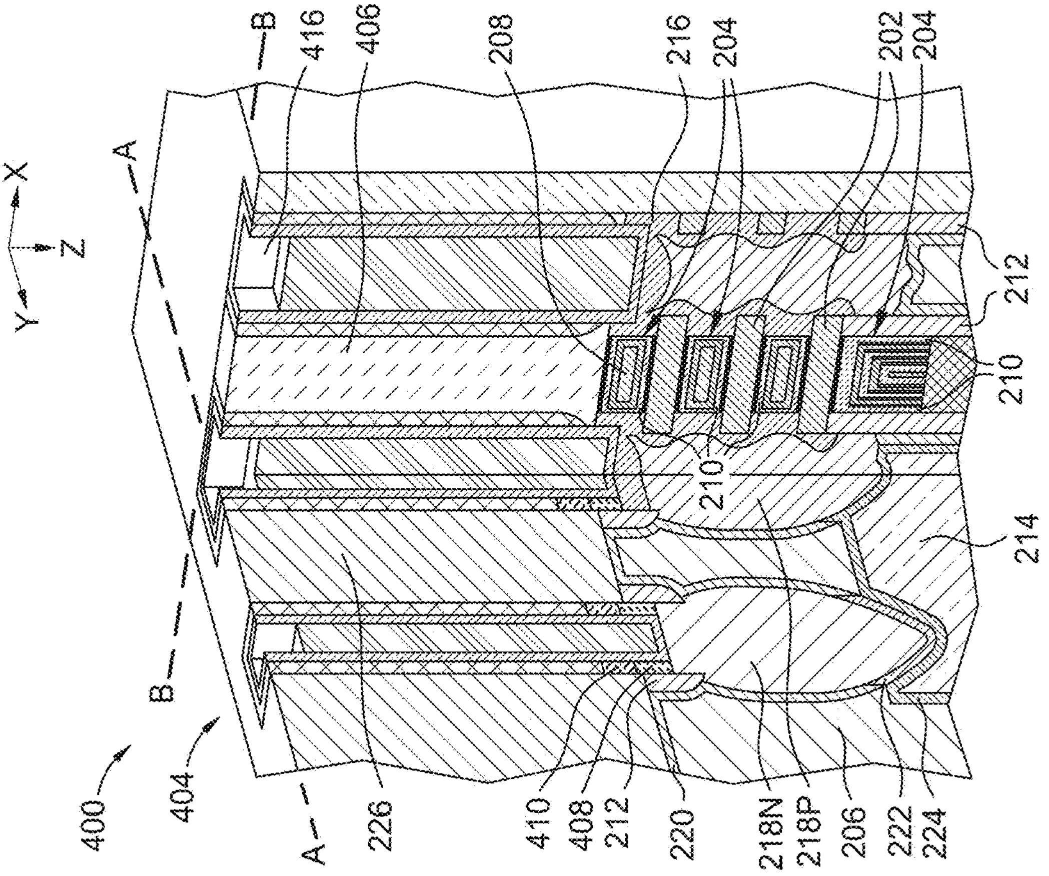

In block 318, a contact recess process is performed to recess the metal contacts 228 to form contact recesses 416, as shown in FIGS. 4I and 4I'. The contact recess process may include any appropriate dry anisotropic etching or wet etching process, performed in a processing chamber, such as the processing chamber 120 shown in FIG. 1.

Figure 4J:
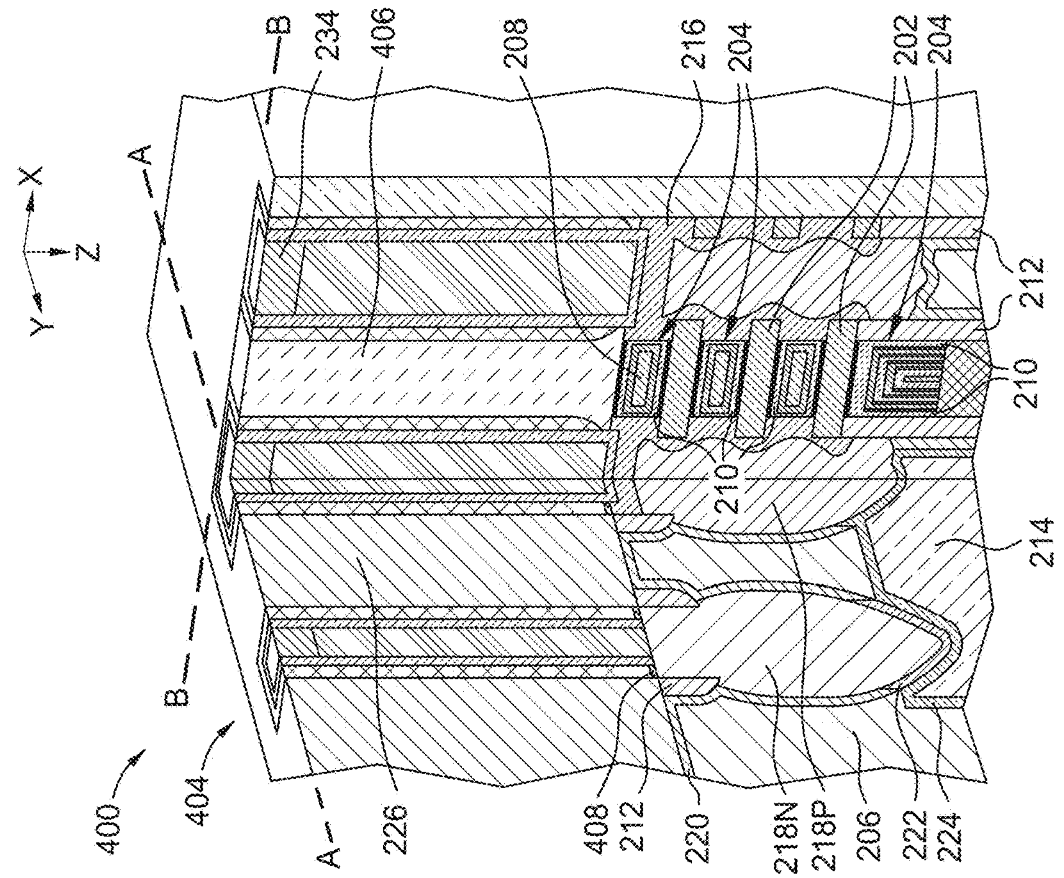
Figure 4J:
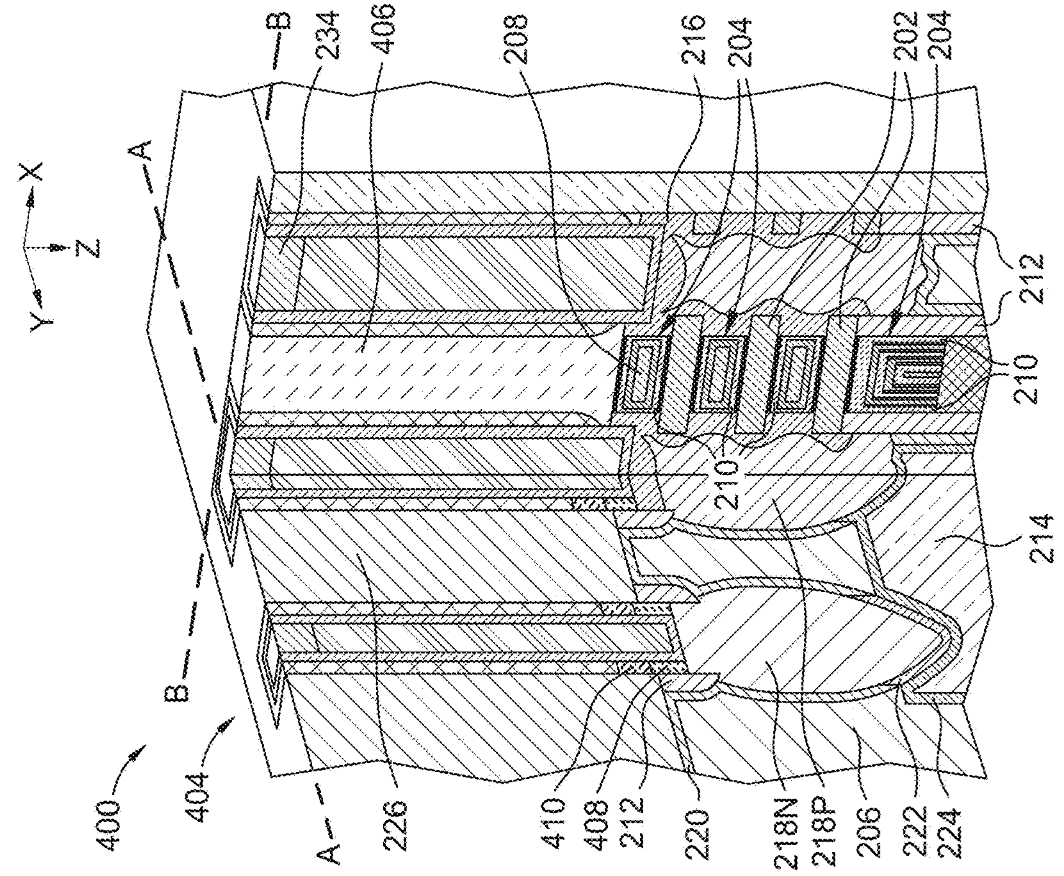

In block 320, a contact cap formation process is performed to form a contact cap layer 234 in the contact recess 416, as shown in FIGS. 4J and 4J'. The contact cap formation process may include any appropriate deposition process, such as chemical vapor deposition (CVD), or physical vapor deposition (PVD), performed in a processing chamber, such as the processing chamber 126, 128, or 130 shown in FIG. 1. The contact cap layer 234 may be formed of silicon oxide ($SiO_2$), silicon oxynitride (SiON), aluminum oxide ($Al_2O_3$), silicon oxy-carbon-nitride (SiOCN), or any combination thereof.

Figure 4K:
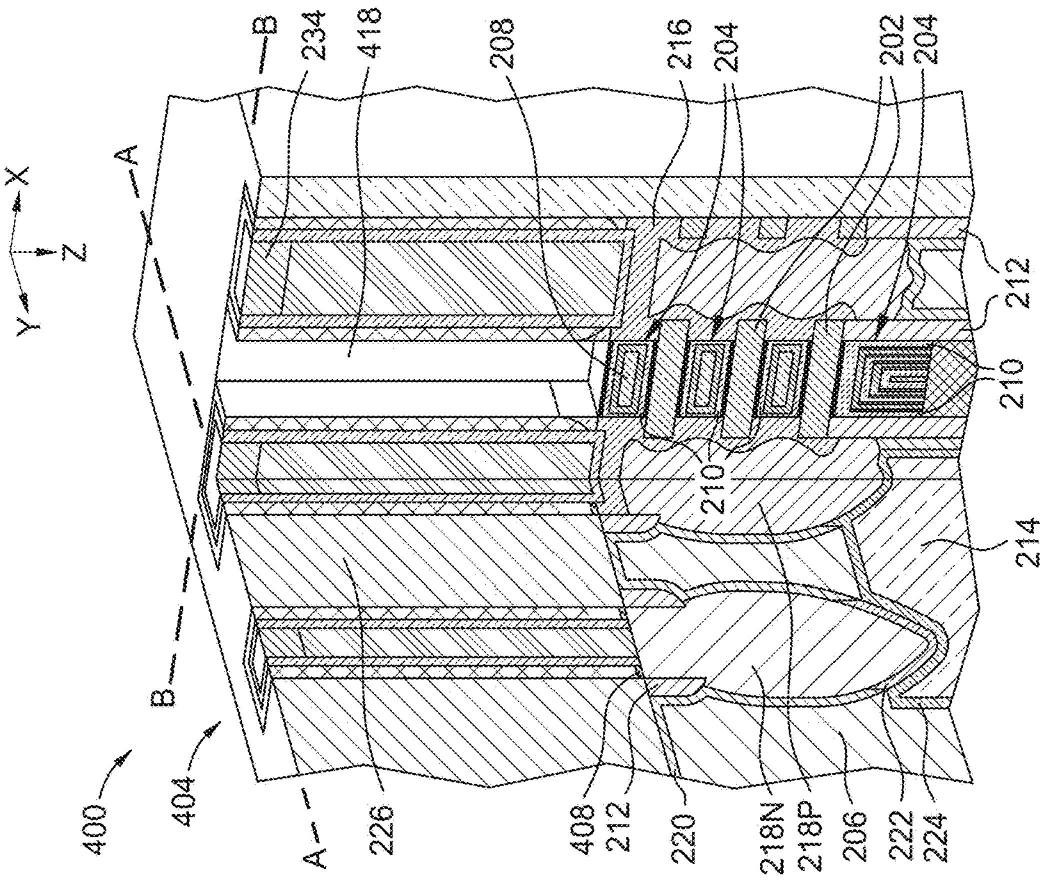
Figure 4K:
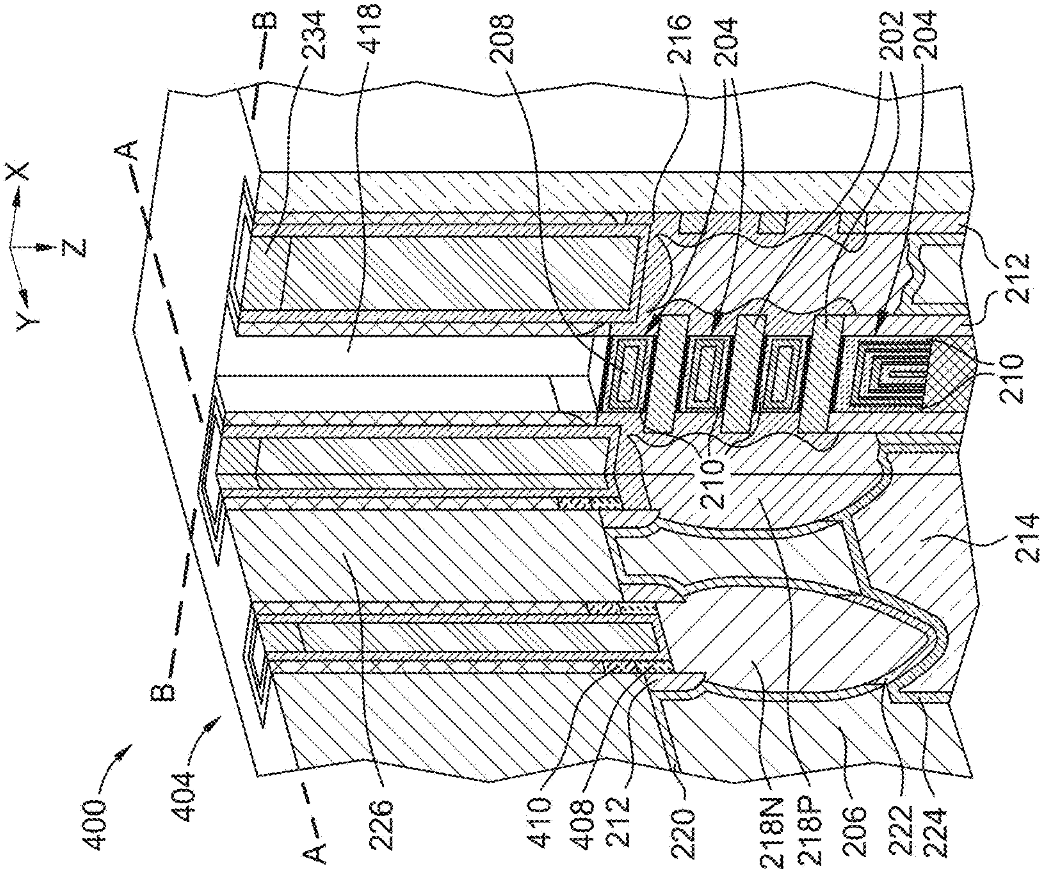

In block 322, an ILD recess process is performed to recess the substrate 406 within the S/D recesses 404 selective to the spacer 232 and the contact cap layer 234 to form an ILD recess 418, as shown in FIGS. 4K and 4K'. The ILD recess process may include any appropriate dry anisotropic etching or wet etching process, performed in a processing chamber, such as the processing chamber 120 shown in FIG. 1. An oxide layer and a nitride spacer (not shown) may be formed at a bottom of the ILD recess 418 to further protect the extension regions 216.

Figure 4L:
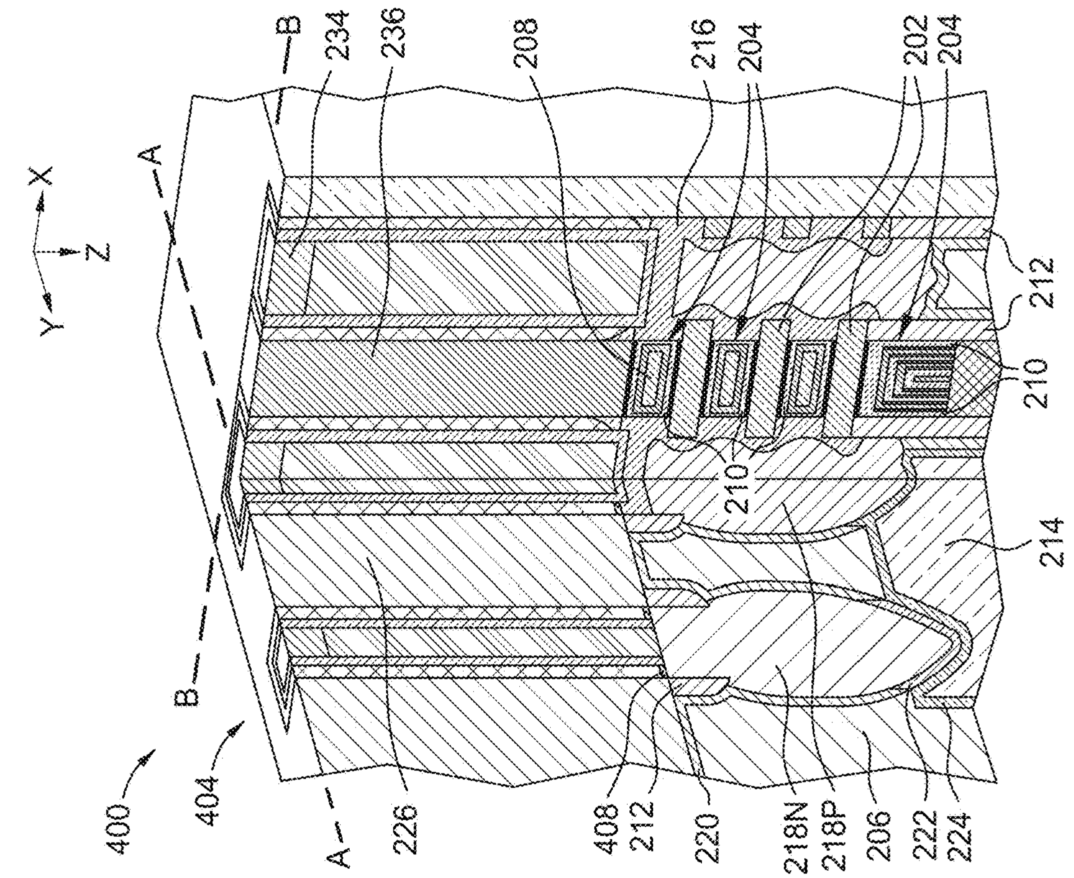
Figure 4L:
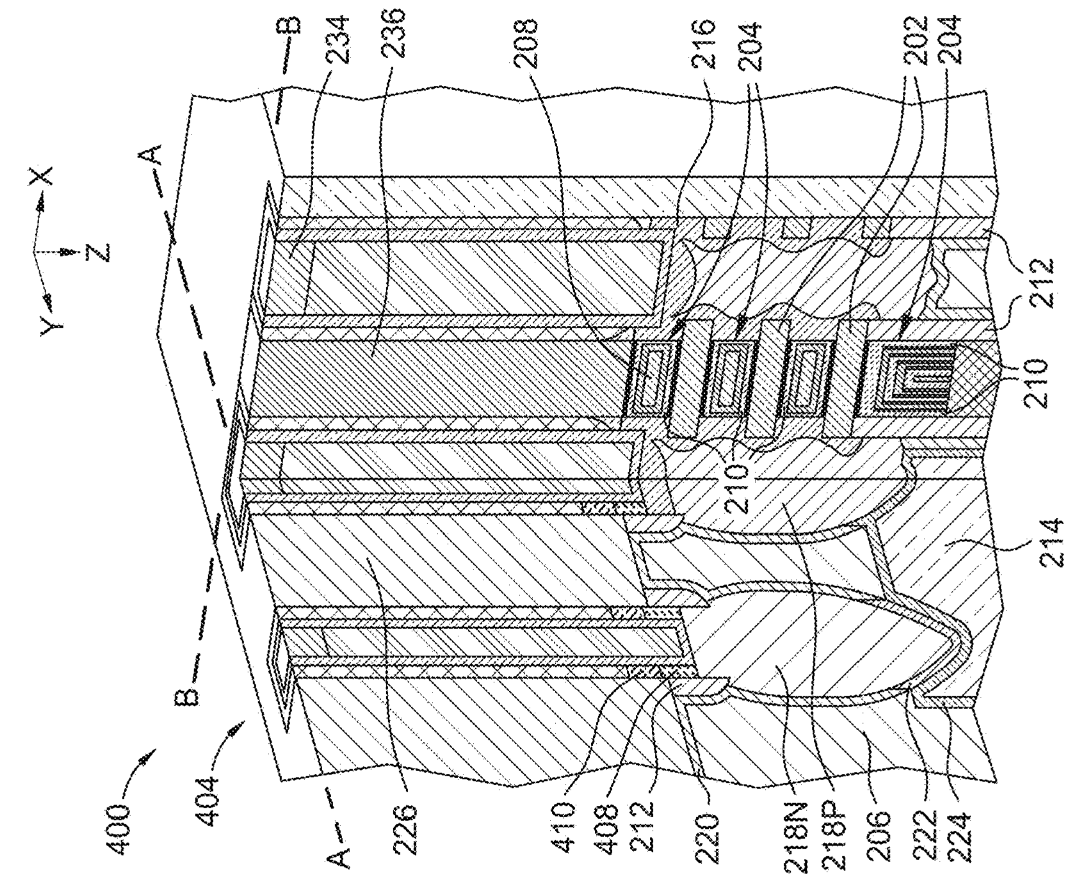

In block 324, an ILD formation process is performed to form an ILD 236 in the ILD recess 418, as shown in FIGS. 4L and 4L'. The ILD 236 may be formed of silicon oxide ($SiO_2$), silicon oxynitride (SiON), aluminum oxide ($Al_2O_3$), silicon oxy-carbon-nitride (SiOCN) or any combination thereof. The backside of the semiconductor structure 400 may be planarized by a chemical mechanical polishing (CMP) process to remove over-filled material (e.g., silicon oxide ($SiO_2$)).

The embodiments described herein provide methods for forming metal contacts isolated from one another by an inter-layer dielectric (ILD) on a backside of a chip while protecting extension regions (e.g., doped silicon (Si) or silicon germanium (SiGe)) on a front side of the chip. In the methods described herein, selective bottom layers (e.g., silicon nitride ($Si_3N_4$)) are used while etching the silicon (Si) wafer to provide etch selectivity. These selective bottom layers also protect underlying extension regions from any damage during the etching of the silicon (Si) wafer.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a portion of a gate-all-around field-effect transistor (GAA FET), comprising:

performing a placeholder forming process to form placeholders, each interfacing with an extension region via a cap layer, in recesses formed in portions of a substrate isolated by shallow trench isolations (STIs), the recesses extending into an inter-layer dielectric (ILD) formed on the substrate;

performing a placeholder removal process to remove the placeholders selectively to the substrate, the cap layers, and the STIs;

performing a selective deposition process to form selective cap layers at bottoms of the recesses;

performing a substrate removal process to isotropically etch the substrate within the recesses;

performing a conformal deposition process to form a spacer on exposed surfaces of the substrate and the selective cap layers within the recesses;

performing a spacer sculpt process to sculpt the spacer on sidewalls of the substrate and the STIs within the recesses;

performing a cap layer removal process to remove the cap layers within the recesses; and performing a contact metallization process to form metal contacts within the recesses.

2. The method of claim 1, wherein the placeholders comprise silicon germanium (SiGe), the cap layers comprise silicon (Si), the extension regions comprise lightly doped silicon (Si) or silicon germanium (SiGe), the STIs comprise silicon oxide ($SiO_2$), and the ILD comprises silicon oxide ($SiO_2$), silicon oxynitride (SiON), aluminum oxide, or ($Al_2O_3$).

3. The method of claim 2, wherein the cap layers each have a thickness of between 1 nm and 30 nm.

4. The method of claim 1, wherein the selective cap layers comprise silicon nitride ($Si_3N_4$), silicon oxide ($SiO_2$), silicon oxy-carbide (SiOC), silicon oxy-carbon-nitride (SiOCN), or amorphous carbon (a-C).

5. The method of claim 4, wherein the selective cap layers each have a thickness of between 2 nm and 30 nm.

6. The method of claim 1, wherein the spacer comprises silicon oxide ($SiO_2$), silicon oxy-carbide (SiOC), silicon oxy-carbon-nitride (SiOCN), or silicon boron carbon nitride (SiBCN), or silicon nitride ($Si_3N_4$).

7. The method of claim 1, wherein the metal contacts comprise tungsten (W), ruthenium (Ru), molybdenum (Mo), copper (Cu), cobalt (Co), titanium (Ti), nickel (Ni), silver (Ag), gold (Au), iridium (Ir), tantalum (Ta), platinum (Pt), conductive oxides or nitrides thereof, or any combination thereof.

8. The method of claim 1, further comprising:

performing a contact recess process to recess the metal contacts and form contact recesses; and performing a contact cap formation process to form a contact cap layer in each of the contact recess.

9. The method of claim 8, further comprising:

performing an ILD recess process to recess the substrate within the recesses selective to the spacer and the contact cap layer to form an ILD recess; and performing an ILD formation process to form an ILD in the ILD recess.

10. A method of forming a portion of a gate-all-around field-effect transistor (GAA FET), comprising:

performing a placeholder forming process to form placeholders, each interfacing with an extension region via a cap layer, in recesses formed in portions of a substrate isolated by shallow trench isolations (STIs), the recesses extending into an inter-layer dielectric (ILD) formed on the substrate;

performing a placeholder removal process to remove the placeholders selectively to the substrate, the cap layers, and the STIs;

performing a substrate removal process to isotropically etch the substrate within the recesses;

performing a conformal deposition process to form a spacer on exposed surfaces of the substrate and the cap layer within the recesses;

performing a spacer sculpt process to sculpt the spacer on sidewalls of the substrate and the STIs within the recesses;

performing a cap layer removal process to remove the cap layers within the recesses; and performing a contact metallization process to form metal contacts within the recesses.

11. The method of claim 10, wherein the placeholders comprise silicon germanium (SiGe), the cap layers comprise silicon (Si), the extension regions comprise lightly doped silicon (Si) or silicon germanium (SiGe), the STIs comprise silicon oxide ($SiO_2$), and the ILD comprises silicon oxide ($SiO_2$), silicon oxynitride (SiON), silicon oxy-carbon-nitride (SiOCN), or aluminum oxide, ($Al_2O_3$).

12. The method of claim 11, wherein the cap layers each have a thickness of between 2 nm and 30 nm.

13. The method of claim 10, wherein the spacer comprises silicon nitride ($Si_3N_4$).

14. The method of claim 10, wherein the metal contacts comprise tungsten (W), ruthenium (Ru), molybdenum (Mo), copper (Cu), cobalt (Co), titanium (Ti), nickel (Ni), silver (Ag), gold (Au), iridium (Ir), tantalum (Ta), platinum (Pt), conductive oxides or nitrides thereof, or any combination thereof.

15. The method of claim 10, further comprising:

performing a contact recess process to recess the metal contacts and form contact recesses; and performing a contact cap formation process to form a contact cap layer in each of the contact recesses.

16. The method of claim 15, further comprising:

performing an ILD recess process to recess the substrate within the recesses selective to the spacer and the contact cap layer to form an ILD recess; and performing an ILD formation process to form an ILD in the ILD recess.

17. A semiconductor structure forming a portion of a gate-all-around field-effect transistor (GAA FET), comprising:

channel layers embedded in an inter-layer dielectric (ILD) formed on a substrate, the channel layers extending in a first direction;

a metal gate embedded in the ILD, the metal gate extending in the first direction;

a source/drain (S/D) contact that is electrically connected to the channel layers via an extension region and S/D epitaxial layers on both sides of the channel layers;

shallow trench isolations (STIs) formed within the substrate;

metal contacts formed between the STIs, the metal contacts extending in a second direction orthogonal to the first direction, wherein each of the metal contacts is electrically connected to one of the S/D epitaxial layers and surrounded by a spacer; and a cap layer formed between the extension region and the spacer.

18. The semiconductor structure of claim 17, wherein the metal contacts have a critical dimension of between 10 nm and 40 nm and spacings of between 20 nm and 50 nm in the plane orthogonal to the second direction and depth of between 10 nm and 100 nm in the second direction.

19. The semiconductor structure of claim 17, wherein the channel layers comprise silicon (Si), germanium (Ge), silicon germanium (SiGe), or indium gallium zinc oxide (IGZO), the metal gate comprises tungsten (W), ruthenium (Ru), molybdenum (Mo), copper (Cu), cobalt (Co), titanium (Ti), nickel (Ni), silver (Ag), gold (Au), iridium (Ir), tantalum (Ta), platinum (Pt), conductive oxides or nitrides thereof, or any combination thereof, the ILD comprises silicon oxide ($SiO_2$), silicon oxynitride (SiON), aluminum oxide ($Al_2O_3$), or any combination thereof, and the cap layers comprise silicon (Si).

20. The semiconductor structure of claim 17, wherein the S/D contact comprises tungsten (W), ruthenium (Ru), molybdenum (Mo), copper (Cu), cobalt (Co), titanium (Ti), nickel (Ni), silver (Ag), gold (Au), iridium (Ir), tantalum (Ta), platinum (Pt), conductive oxides or nitrides thereof, or any combination thereof, the extension region comprises lightly doped silicon (Si) or silicon germanium (SiGe), the S/D epitaxial layers comprise epitaxially grown silicon germanium (SiGe).

* * * * *